(12) United States Patent
Lai

(10) Patent No.: US 6,626,683 B2
(45) Date of Patent: Sep. 30, 2003

(54) LAND GRID ARRAY OR BALL GRID ARRAY TYPE INTEGRATED CIRCUIT SOCKET

(76) Inventor: Kuang-Chih Lai, No. 2, Lane 10, Sheng-Li Street, Tu-Cheng City, Taipei Hsien (TW)

( * ) Notice: Subject to any disclaimer, the term of this patent is extended or adjusted under 35 U.S.C. 154(b) by 0 days.

(21) Appl. No.: 10/321,681

(22) Filed: Dec. 18, 2002

(65) Prior Publication Data

US 2003/0124882 A1 Jul. 3, 2003

(30) Foreign Application Priority Data

Dec. 28, 2001 (TW) ..................... 90223455 U

(51) Int. Cl.[7] .............................................. H01R 12/00
(52) U.S. Cl. ........................................ 439/73; 439/331
(58) Field of Search ........................... 439/73, 266, 66, 439/591, 71, 331

(56) References Cited

U.S. PATENT DOCUMENTS

| | | | |
|---|---|---|---|
| 4,502,747 A | * 3/1985 | Bright et al. | ............... 439/331 |
| 5,192,213 A | 3/1993 | Kosugi et al. | |
| 5,199,889 A | 4/1993 | McDevitt, Jr. | |
| 5,232,372 A | 8/1993 | Bradley et al. | |
| 5,241,453 A | * 8/1993 | Bright et al. | ............... 439/331 |
| 5,302,853 A | * 4/1994 | Volz et al. | ................... 439/331 |
| 5,320,559 A | 6/1994 | Uratsuji et al. | |
| 5,362,241 A | 11/1994 | Matsuoka et al. | |
| 5,389,819 A | 2/1995 | Matsuoka et al. | |
| 5,419,710 A | 5/1995 | Pfaff | |
| 5,456,613 A | 10/1995 | McHugh | |
| 5,499,929 A | * 3/1996 | Miyazawa | ................... 439/331 |
| 6,296,520 B1 | * 10/2001 | Horng | .......................... 439/71 |

* cited by examiner

*Primary Examiner*—Tho D. Ta
(74) *Attorney, Agent, or Firm*—Rosenberg, Klein & Lee

(57) ABSTRACT

A land grid array or ball grid array type integrated circuit socket including a metal basin having a bottom face and multiple side walls. An insulating board snugly inlaid in the metal basin. Multiple conductive members inlaid in the insertion holes of the insulating board, upper and lower ends of the conductive members respectively correspondingly contacting with the terminals of the integrated circuit and conductive contacts of the circuit board. An upper cover bottom face of which has a receiving section for accommodating the integrated circuit therein, the upper cover being latched on the metal basin. Clamping leaf springs mounted on one side of the upper cover for fixing the integrated circuit in the receiving section of the upper cover. The resilient section of the conductive member integrally transversely extending from the inlay section. Therefore, the resilient section has longer length and greater resilience, while having not high height.

13 Claims, 24 Drawing Sheets

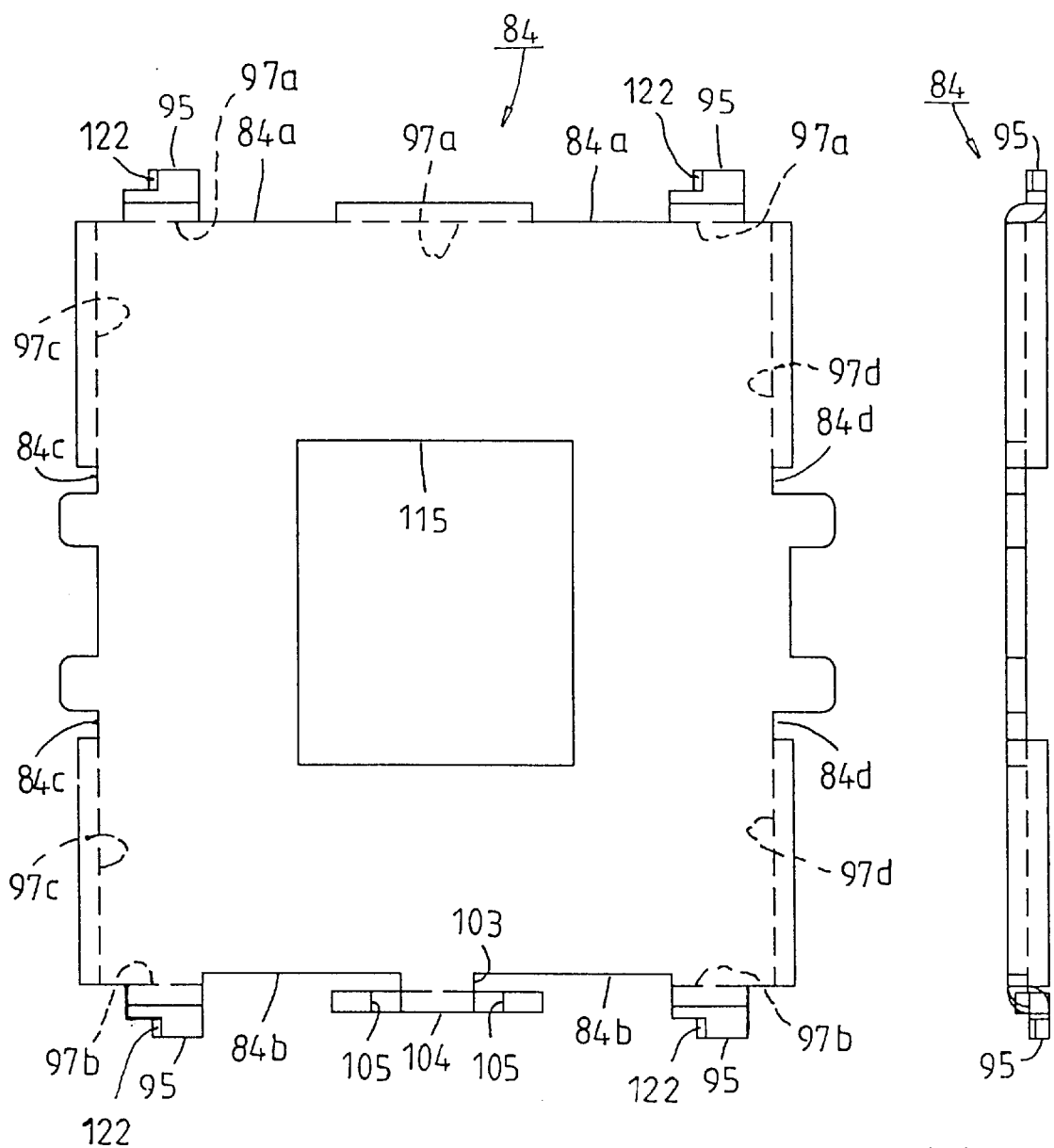
Fig. 4
Fig. 6
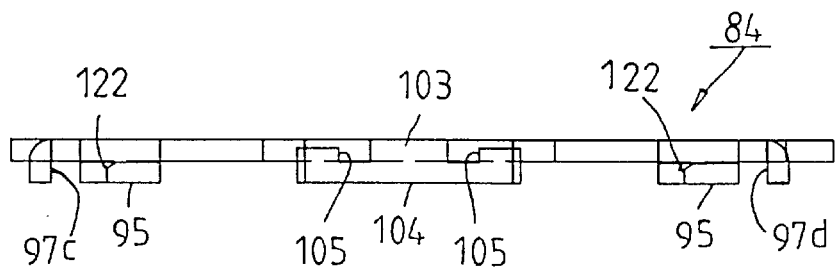
Fig. 5

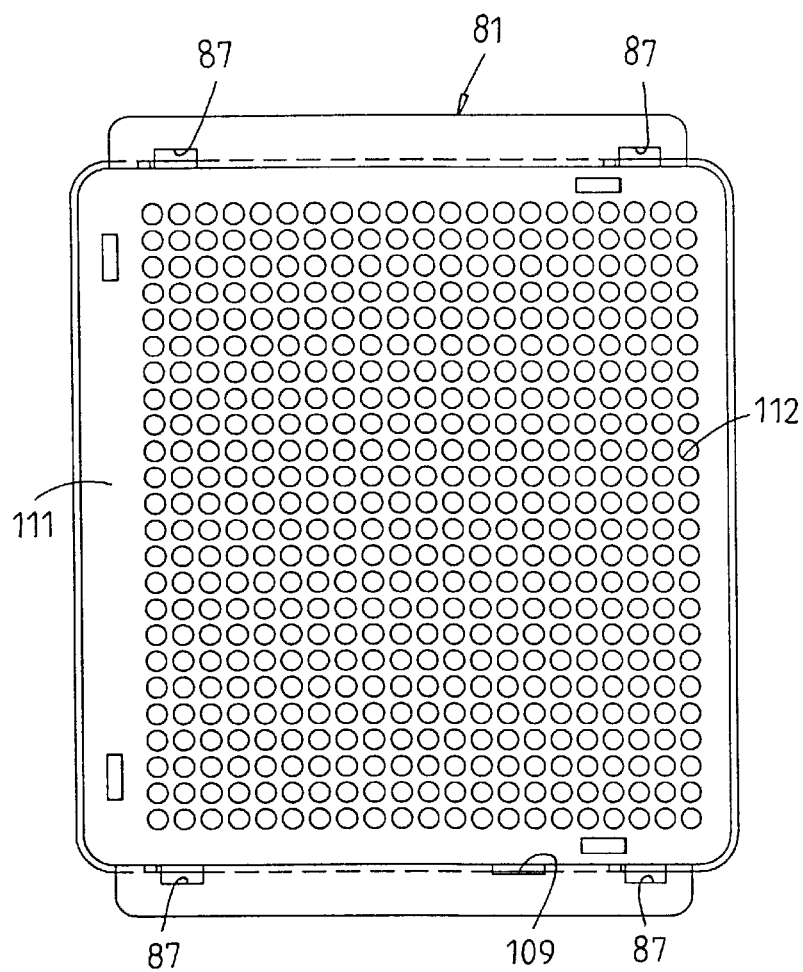
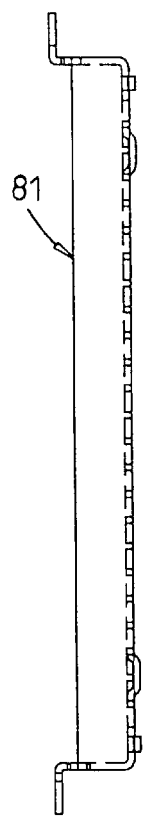
Fig.14
Fig.16
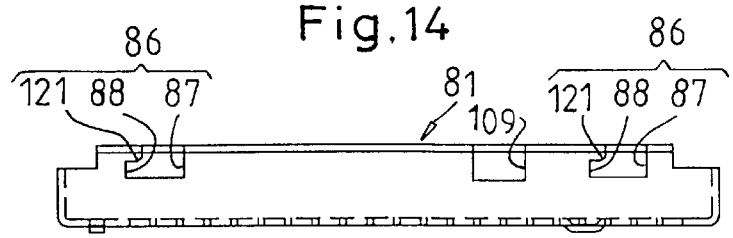
Fig.15

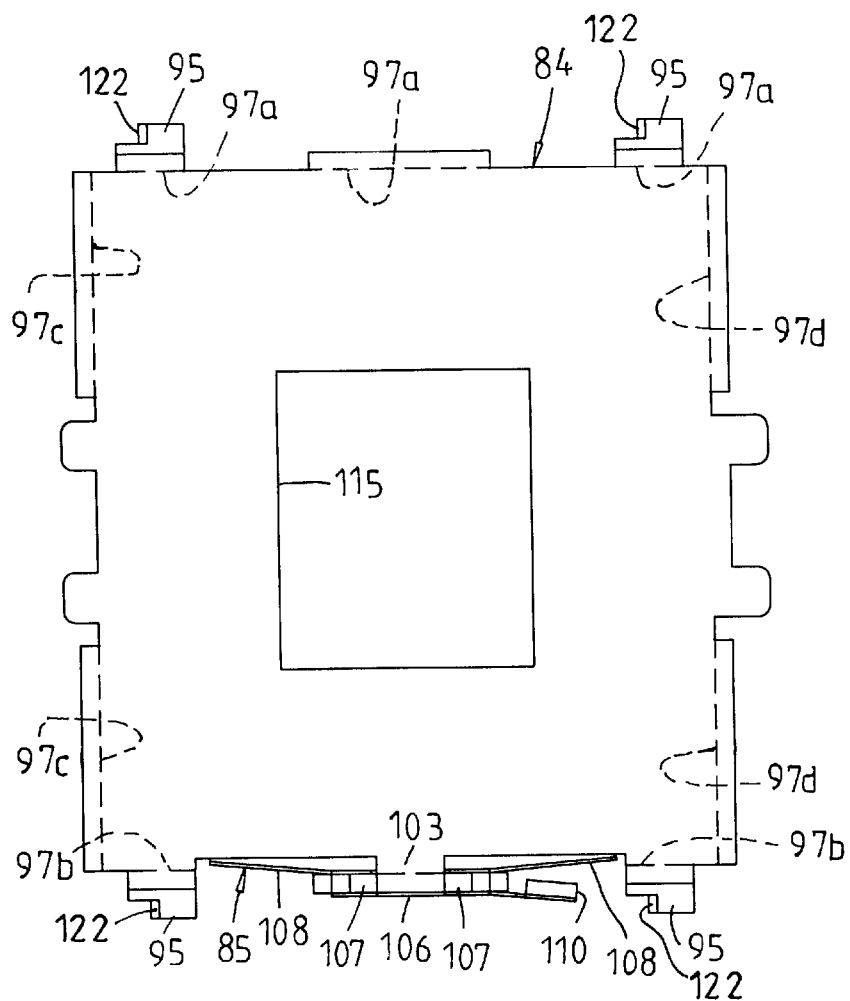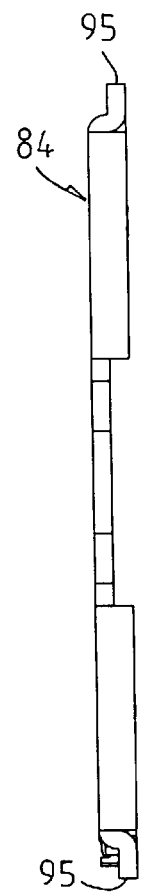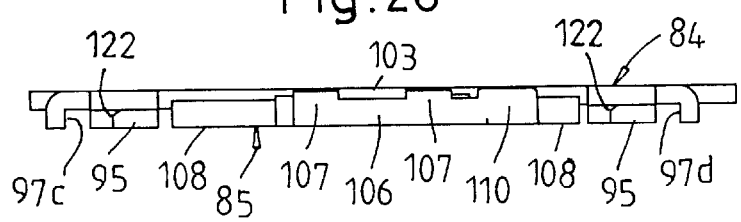
Fig. 28
Fig. 30
Fig. 29

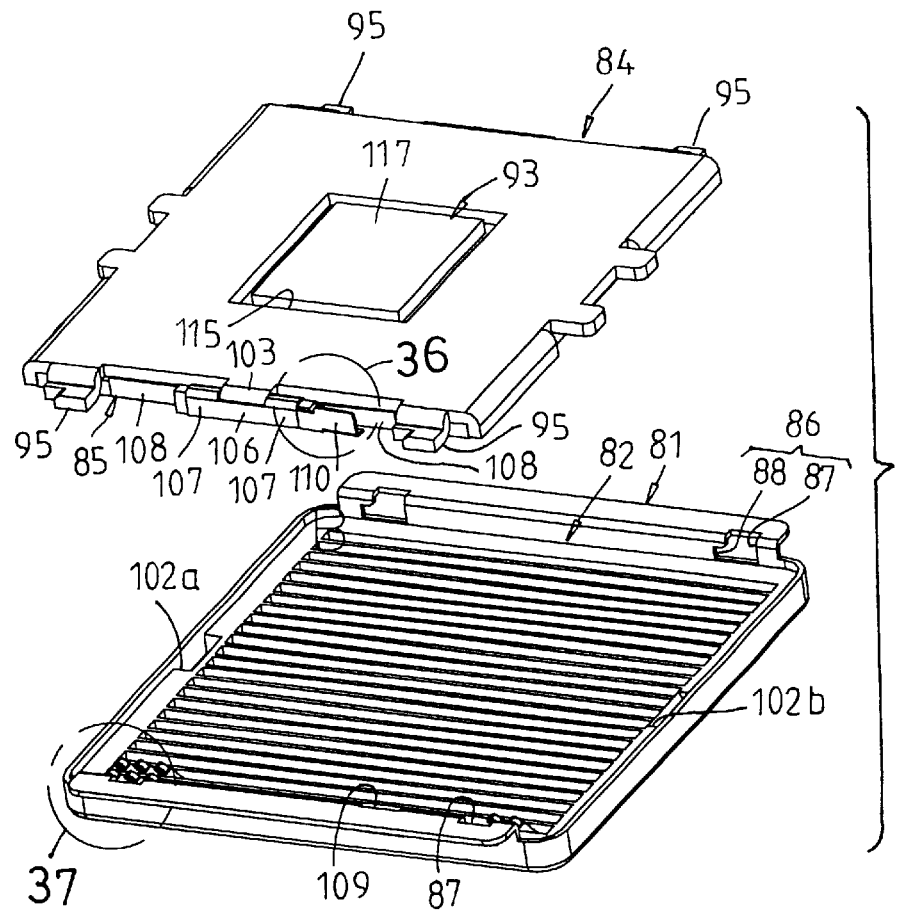
Fig. 35
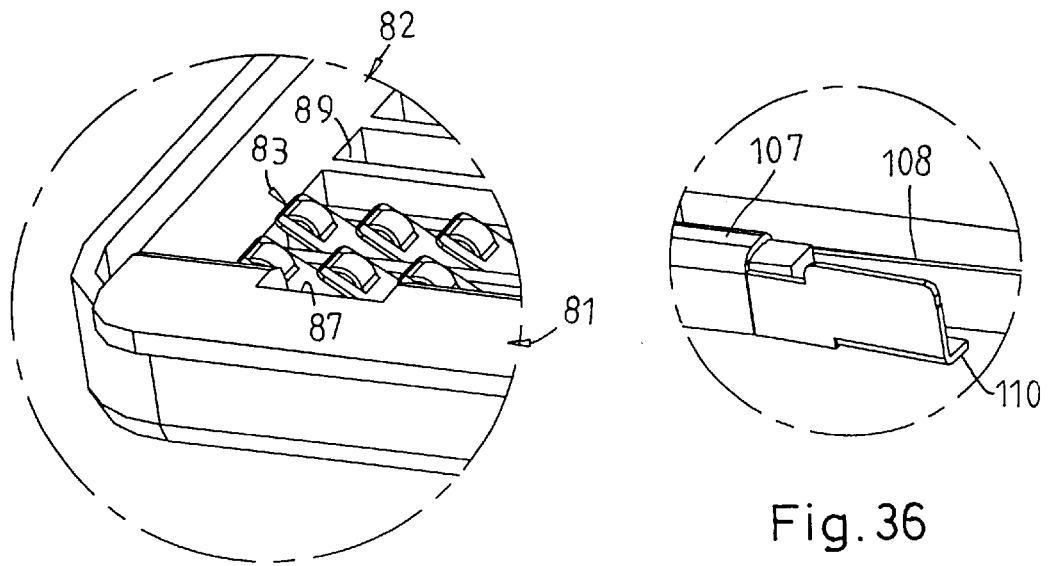
Fig. 37
Fig. 36

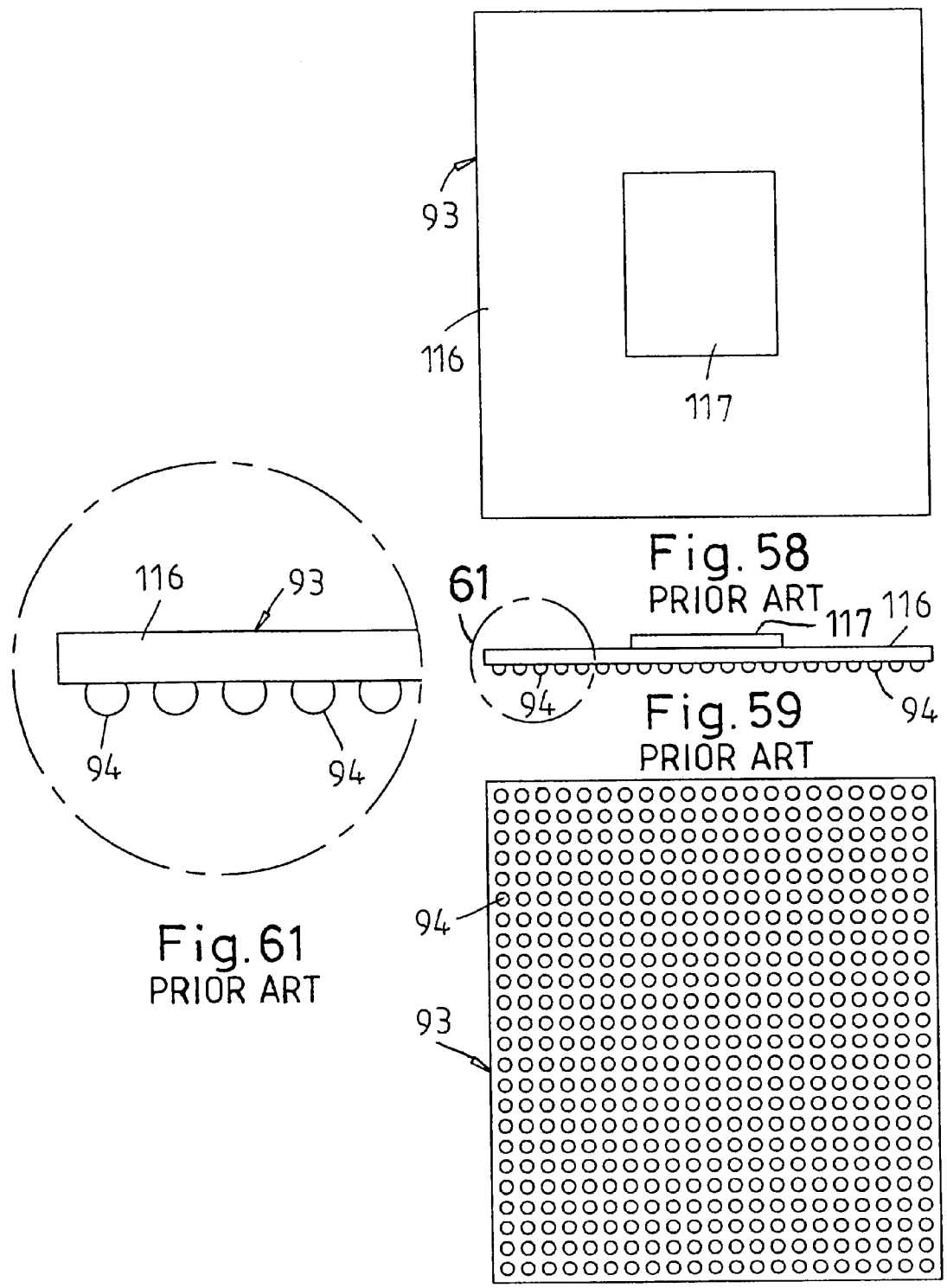

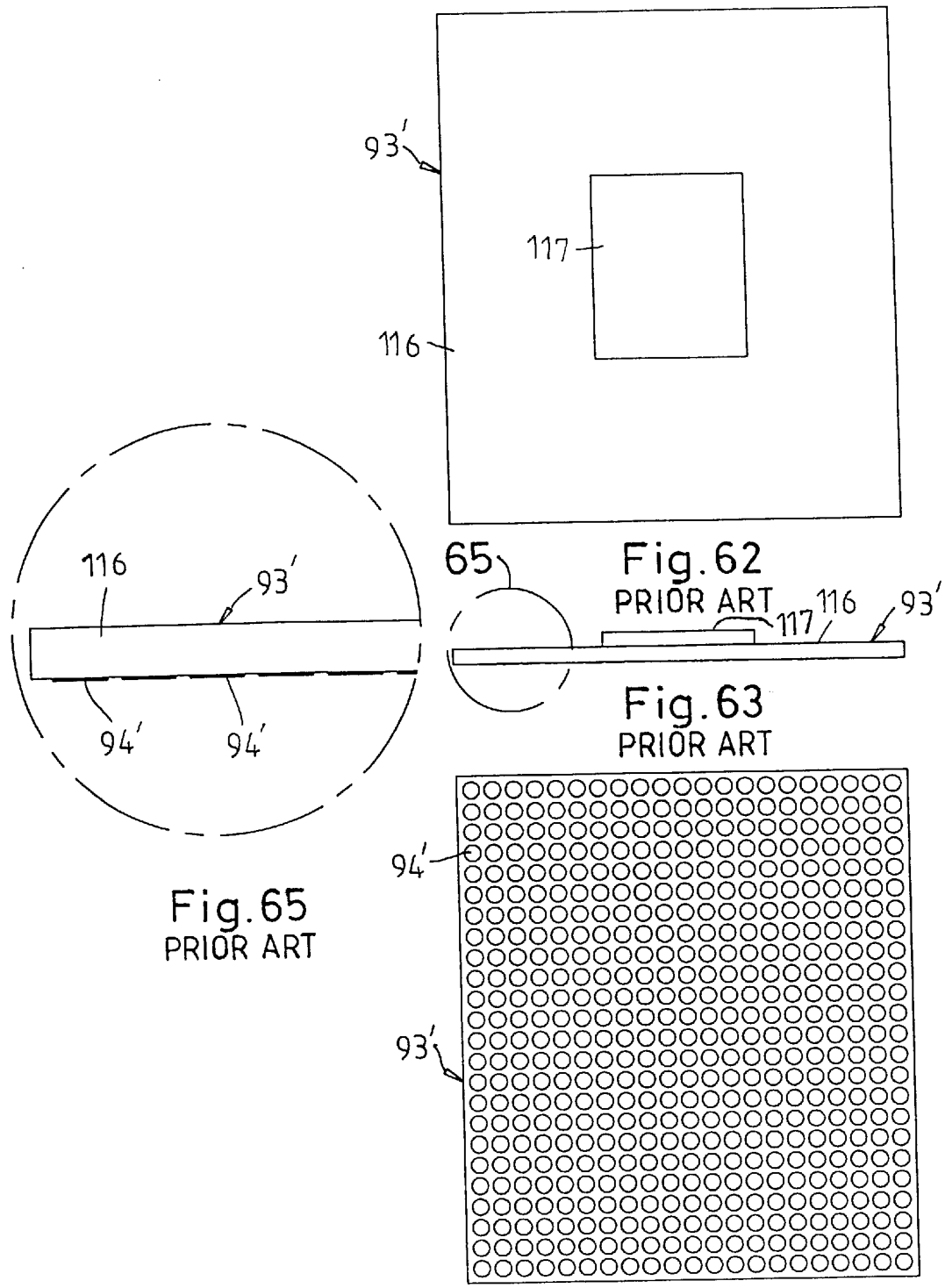

LAND GRID ARRAY OR BALL GRID ARRAY TYPE INTEGRATED CIRCUIT SOCKET

BACKGROUND OF THE INVENTION

1. Field of the Invention

The present invention is related to an integrated circuit socket, and more particularly to a land grid array or ball grid array type integrated circuit socket.

2. Description of the Prior Arts

Depending on the structure, the terminals of integrated circuit, especially central processor unit (CPU), can be divided into three types of pin grid array (P.G.A.), ball grid array (B.G.A.) and land grid array (L.G.A.).

U.S. Pat. No. 5,456,613 discloses a socket structure specifically for the P.G.A. type integrated circuit. The terminal of P.G.A. type integrated circuit is considerably long. Therefore, very high conductive members are inlaid in a very thick insulating socket to respectively electrically contact with the terminal of the P.G.A. type integrated circuit and the contacts of the printed circuit board. Accordingly, the socket structure specifically for the P.G.A. type integrated circuit has a considerable thickness.

The B.G.A. type integrated circuit has been developed for shortening the length of the terminal. As shown in FIGS. 58 to 61, the long leg terminal of the P.G.A. type integrated circuit is changed into ball grid, for example, tin ball or copper ball. This greatly shortens the length of the terminal of the integrated circuit. U.S. Pat. No. 5,419,710 discloses a socket specifically for the B.G.A. type integrated circuit.

In order to further simplify the terminal of the integrated circuit, L.G.A. type integrated circuit has been developed recently. As shown in FIGS. 62 to 65, the terminal of the integrated circuit is changed into flat plane land grid so as to simplify the structure and lower the manufacturing cost and achieve better contact and conductive effect. U.S. Pat. Nos. 5,192,213, 5,199,889, 5,232,372, 5,320,559, 5,362,241 and 5,389,819 disclose various sockets specifically for the L.G.A. type integrated circuit.

In order to minify the area of the integrated circuit, the pitch between each two adjacent terminals has been more and more reduced. Presently, the mostly seen pitch is 1.27 mm. In such narrow pitch, it is hard to insert conductive members. In the case that the conductive member is further required to have sufficient up and down resilience, the extensible resilient section of the conductive member can only extend in a direction perpendicular to the face of the terminal of the integrated circuit. Therefore, the existent sockets all have quite thick thickness.

In addition, the resilient section extending in the direction perpendicular to the face of the terminal of the integrated circuit has complicated structure and fails to have sufficient up and down resilience under limitation of the 1.27 mm pitch.

Furthermore, due to manufacturing tolerance, the contact ends of the respective conductive members in contact with the integrated circuit are inevitably ununified. When pressing the integrated circuit to make the terminals thereof contact with the contact ends of the conductive members, the resilient sections of the conductive members are compressed and contracted by the integrated circuit only to a limited extent. Therefore, some of the terminals of the integrated circuit fail to truly contact with the conductive members of the socket. This leads to problem of poor contact.

SUMMARY OF THE INVENTION

It is therefore a primary object of the present invention to provide a land grid array or ball grid array type integrated circuit socket in which the resilient section of the conductive member integrally obliquely or windingly transversely extends from the inlay section. When the conductive member is compressed by the integrated circuit into a final contact position, the projection length of the resilient section on the face of the insulating board is larger than the pitch between any two adjacent terminals of the integrated circuit. Therefore, the resilient section of the conductive member is not limited by the extremely small pitch such as 1.27 mm pitch. Therefore, the resilient section can have longer length and greater resilience, while having not high height. Therefore, the resilient section can better and more truly contact with the terminal of integrated circuit.

It is a further object of the present invention to provide the above land grid array or ball grid array type integrated circuit socket in which the resilient section of the conductive member has the above special structure so that the manufacturing tolerance of the terminals of the integrated circuit and the tolerance resulting from the bending and deformation of the integrated circuit when pressed into the socket can be absorbed. Therefore, the contact ends of every conductive members can fully and reliably contact with every terminals of the integrated circuit.

It is still a further object of the present invention to provide the above land grid array or ball grid array type integrated circuit socket in which the resilient section of the conductive member has the above special structure so that the entire socket becomes thinner and has stronger structure and it is ensured that the insulating board of the socket be not deformed.

It is still a further object of the present invention to provide the above land grid array or ball grid array type integrated circuit socket which achieves a good shielding effect to avoid leakage of electromagnetic wave generated by the integrated circuit and meet the standard of shielding of electromagnetic interference (EMI).

According to the above objects, the land grid array or ball grid array type integrated circuit socket of the present invention includes: a metal basin which is a box body having a bottom face and multiple side walls, two opposite side walls of the metal basin being respectively formed with latch perforations, each latch perforation having an opening section and a latch section communicating with the opening section; an insulating board snugly inlaid in the metal basin, the insulating board having multiple insertion holes passing through the insulating board; multiple conductive members which are one by one inlaid in the insertion holes of the insulating board and passed through the metal basin to contact with multiple corresponding land grid array conductive contacts of a circuit board and contact with multiple land grid array or ball grid array terminals of the integrated circuit, whereby the conductive contacts of the circuit board are electrically connected with the terminals of the integrated circuit; an upper cover having a first side, a second side opposite to the first side, a third side connected with one end of the first side and second side and a fourth side connected with the other end of the first side and second side, the upper cover further including multiple latch tenons which are disposed on the first and second sides and can be correspondingly placed into the opening section of the latch perforation of the metal basin and latched in the latch section, whereby the upper cover is latched on the metal basin to cover upper side thereof, the upper cover having a receiving section for accommodating the integrated circuit therein, the receiving section including: a first locating section disposed on the first side, the first locating section being integrally downward bent from the upper cover and protruding from the bottom face of the upper cover, whereby when the integrated circuit is attached to the bottom face of the upper cover, the first locating section is adjacent to a first edge of the integrated circuit; a second locating section disposed on the second side, the second locating section being integrally downward bent from the upper cover and protruding from the bottom face of the upper cover, the second locating section being adjacent to a second edge of the integrated circuit; a third locating section disposed on the third side, the third locating section being integrally downward bent from the upper cover and protruding from the bottom face of the upper cover, whereby when the integrated circuit is attached to the bottom face of the upper cover, the third locating section is adjacent to a third edge of the integrated circuit; and a fourth locating section disposed on the fourth side, the fourth locating section being integrally downward bent from the upper cover and protruding from the bottom face of the upper cover, whereby when the integrated circuit is attached to the bottom face of the upper cover, the fourth locating section is adjacent to a four edge of the integrated circuit; and clamping leaf springs mounted on the second side of the upper cover for resiliently pressing the second edge of the integrated circuit, whereby by means of the first locating section of the first side of the upper cover and the clamping leaf springs disposed on the upper cover, the opposite first and second edges of the integrated circuit are clamped to hold the integrated circuit under the bottom face of the upper cover.

Each conductive member has an inlay section, a first contact section, a second contact section and a resilient section. The inlay section is inlaid in the insertion hole of the insulating board. The first contact section integrally downward extends from the inlay section and is further bent to electrically contact with the land grid array conductive contacts of the circuit board. The resilient section integrally obliquely or windingly transversely extends from the inlay section, whereby when the conductive member is compressed by the integrated circuit into a final contact position, a projection length of the resilient section on the face of the insulating board is larger than the pitch between any two adjacent terminals of the integrated circuit. The second contact section is integrally formed at free end of the resilient section to slidably press and electrically contact with the terminals of the integrated circuit. When the resilient section and the second contact section slidably press and contact with the terminals of the integrated circuit, the resilient section and the second contact section are pressed by the terminals into the receiving channels of the insulating board.

The third side and fourth side of the insulating board are respectively formed with notches. A tool such as a screwdriver can be extended into one of the notches to abut against the metal basin. By means of the screwdriver, the upper cover can be pried and moved toward a latched position to make the latch tenons of the upper cover slide from the opening section to the latch section so as to latch the upper cover and the integrated circuit in the metal basin. Reversely, a tool such as a screwdriver can be inserted into the other notch to abut against the metal basin and by means of the screwdriver, the upper cover can be pried and moved toward an unlatched position to make the latch tenons of the upper cover slide from the latch section to the opening section so as to take the upper cover and the integrated circuit out from the metal basin.

The second locating section of the upper cover further includes a neck section, a latch beam and two latch sections. The neck section outward extends from the second side of the upper cover and is downward bent. The latch beam extends from the neck section in parallel to or substantially in parallel to the second side of the upper cover. The two latch sections are respectively formed at two ends of the latch beam. The clamping leaf spring has a base section, latch clips and leaf spring sections. The latch clips respectively windingly extend from upper sides of two ends of the base section for clamping the latch sections of the upper cover to mount the clamping leaf spring on the second locating section of the upper cover. The leaf spring sections respectively obliquely extend from the rear ends of the latch clips to resiliently press the second edge of the integrated circuit so as to clamp and locate the integrated circuit on the bottom face of the upper cover.

The second side of the metal basin further has a locking section. The clamping leaf spring further has a latch plate bent from one end of the base section to a corresponding leaf spring section, whereby after the upper cover and the integrated circuit slide to make the latch tenons of the upper cover latched with the latch sections, the clamping leaf spring is latched on the locking section the metal basin to make the upper cover and the integrated circuit locked in the metal basin.

The bottom of the metal basin has a base board formed with multiple through holes corresponding to the multiple conductive members.

The bottom of the metal basin has a base board. The center of the base board is formed with a perforation. The base board is formed with multiple through holes corresponding to the multiple conductive members.

The bottom of the metal basin has a base board. The base board is formed with a perforation covering an area in which all the conductive members are inlaid.

A guide slope is formed on an adjoining section adjoining the opening section with the latch section of the latch perforation of the metal basin, whereby the latch tenon of the upper cover can be guided by the guide slope to smoothly slide into the latch section of the latch perforation and be fixed therein.

The upper cover is further formed with a hole. The integrated circuit is passed through the hole of the upper cover to contact with heat-radiating fins mounted on upper side of the upper cover.

The upper cover has a complete top face for totally shielding the integrated circuit and avoiding leakage of electromagnetic wave generated by the integrated circuit.

The upper cover is made of metal board.

The insulating board further has multiple receiving channels and the insertion holes are formed on the bottoms of the receiving channels.

The present invention can be best understood through the following description and accompanying drawings wherein:

BRIEF DESCRIPTION OF THEM DRAWINGS

FIG. 4 is a top view of the first embodiment of the upper cover of the present invention;

FIG. 5 is a front view of the first embodiment of the upper cover of the present invention;

FIG. 6 is a right view of the first embodiment of the upper cover of the present invention;

FIG. 14 is a top view of the first embodiment of the metal basin of the present invention;

FIG. 15 is a front view of the first embodiment of the metal basin of the present invention;

FIG. 16 is a right view of the first embodiment of the metal basin of the present invention;

FIG. 28 is a top view of the clamping leaf spring of the present invention, which is mounted on the upper cover;

FIG. 29 is a right view of the clamping leaf spring of the present invention, which is mounted on the upper cover;

FIG. 30 is a front view of the clamping leaf spring of the present invention, which is mounted on the upper cover;

FIG. 35 is a perspective view showing that the integrated circuit is clamped and located on the bottom face of the upper cover and the insulating board is mounted in the metal basin to be further assembled;

FIG. 36 is an enlarged view of the circled area 36 of FIG. 35;

FIG. 37 is an enlarged view of the circled area 37 of FIG. 35;

FIG. 58 is a top view of the land grid array integrated circuit;

FIG. 59 is a front view of the land grid array integrated circuit;

FIG. 60 is a bottom view of the land grid array integrated circuit;

FIG. 61 is an enlarged view of the circled area 61 of FIG. 59;

FIG. 62 is a top view of the ball grid array integrated circuit;

FIG. 63 is a front view of the ball grid array integrated circuit;

FIG. 64 is a bottom view of the ball grid array integrated circuit; and

FIG. 65 is an enlarged view of the circled area 65 of FIG. 63.

DETAILED DESCRIPTION OF THE PREFERRED EMBODIMENTS

Figure 1:
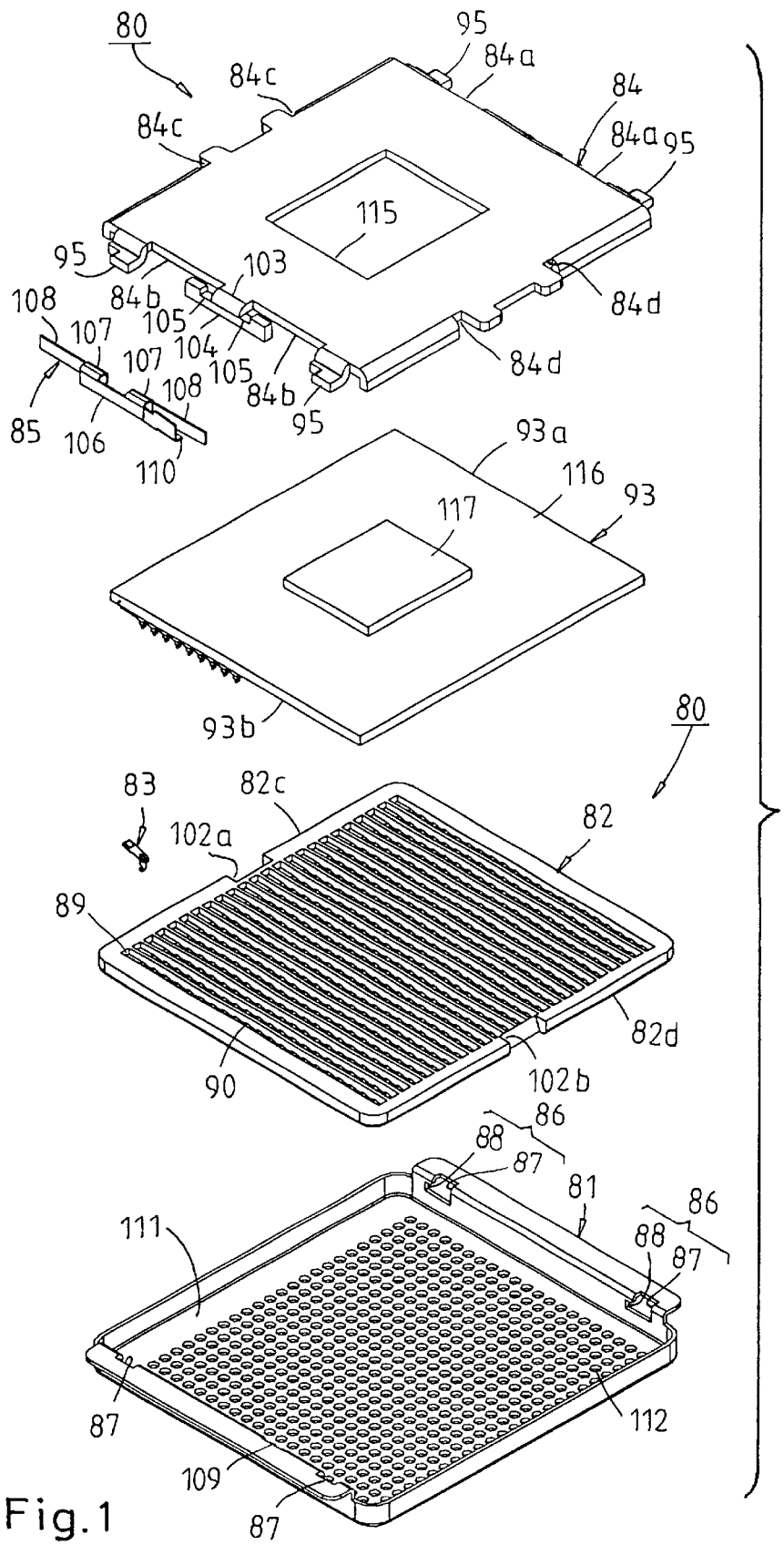
FIG. 1 is a perspective exploded view of the present invention.
Figure 2:
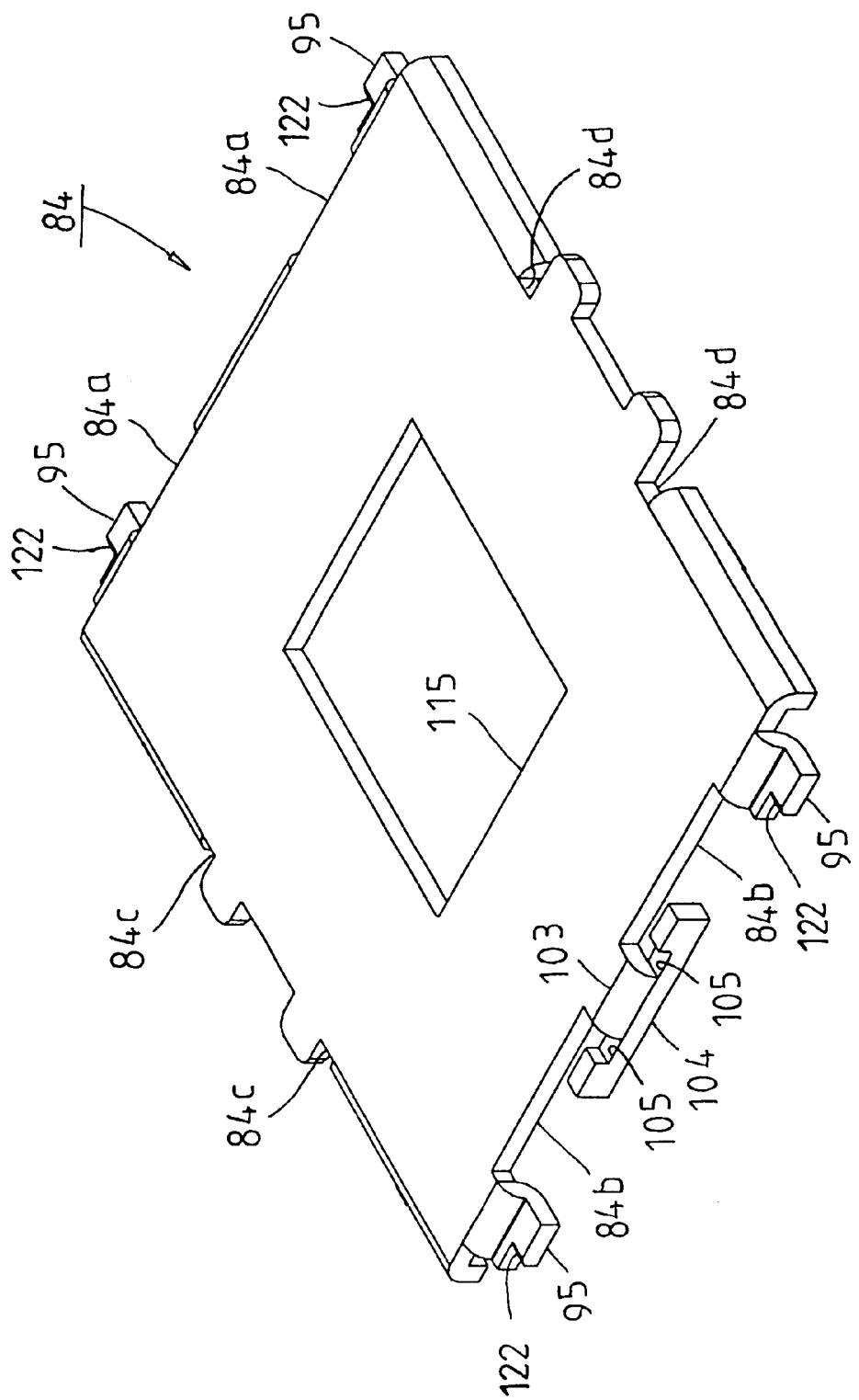
FIG. 2 is a top perspective view of a first embodiment of the upper cover of the present invention.
Figure 3:
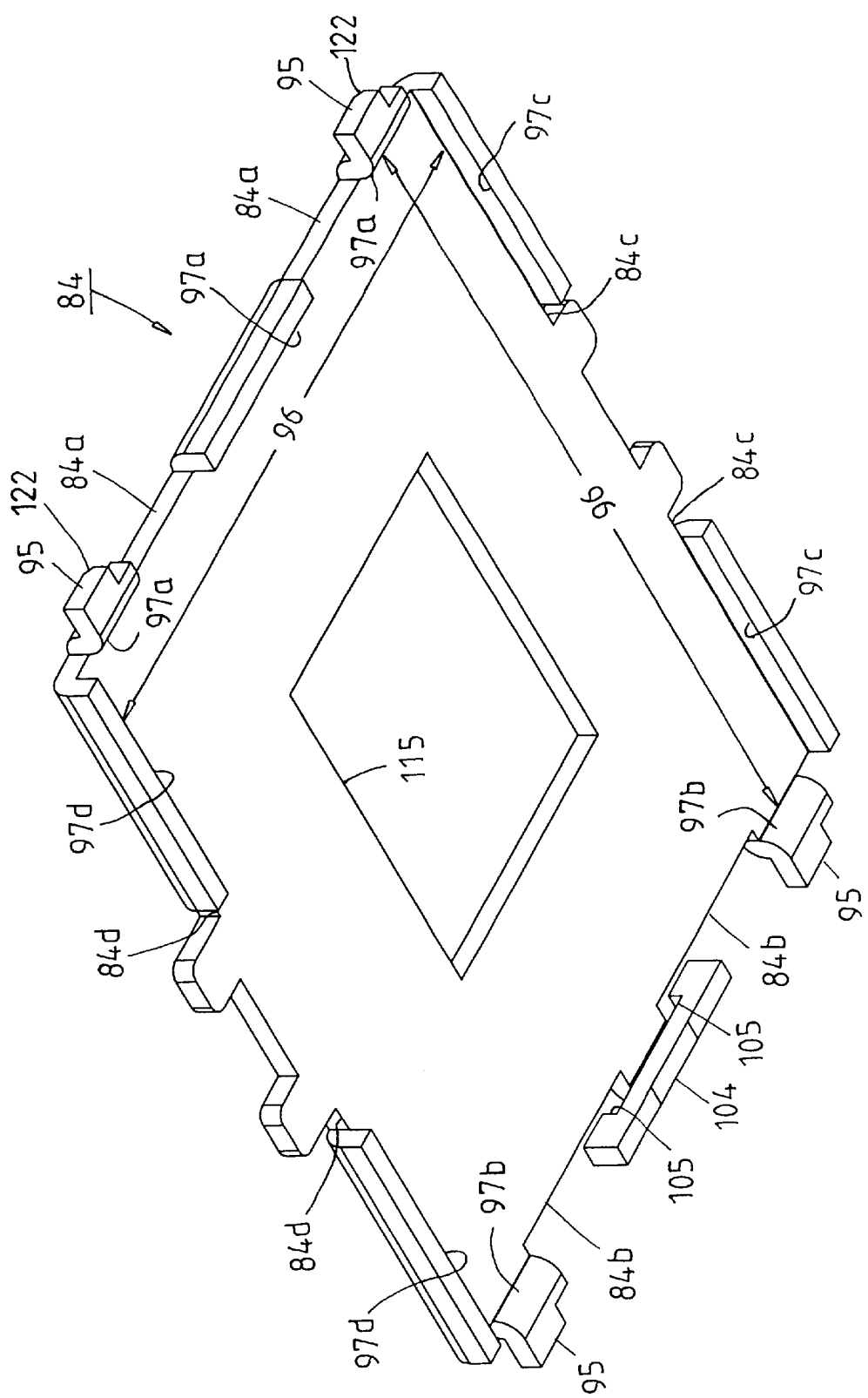
FIG. 3 is a bottom perspective view of the first embodiment of the upper cover of the present invention.

Please refer to FIG. 1. The land grid array (L.G.A.) or ball grid array (B.G.A.) type integrated circuit socket 80 of the present invention includes a metal basin 81, an insulating board 82, multiple conductive members 83, an upper cover 84 and clamping leaf spring 85.

Referring to FIGS. 1 and 13 to 18, the metal basin 81 is a box body having a bottom face and multiple side walls. The opposite first and second side walls are respectively formed with latch perforations 86. Each latch perforation 86 has an opening section 87 and a latch section 88 communicating with the opening section 87. A guide slope 121 is formed on an adjoining section adjoining the opening section 87 with the latch section 88.

Figure 11:
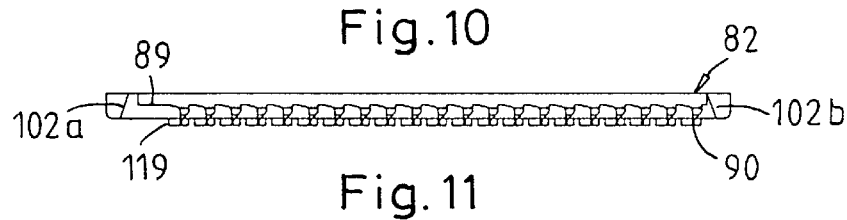
FIG. 11 is a sectional view taken along line 11—11 of FIG. 10.
Figure 12:
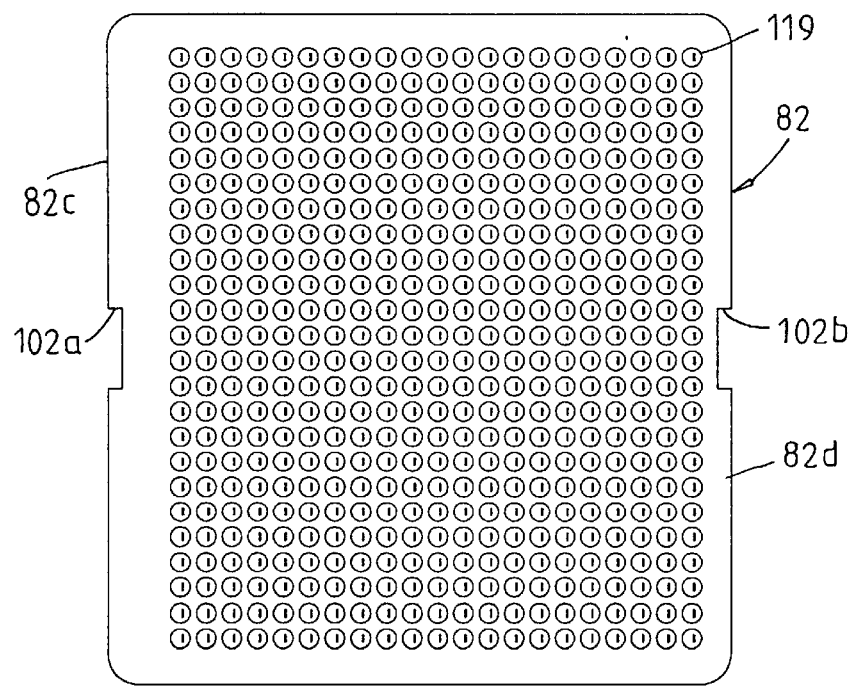
FIG. 12 is a bottom view of the insulating board of the present invention.
Figure 13:
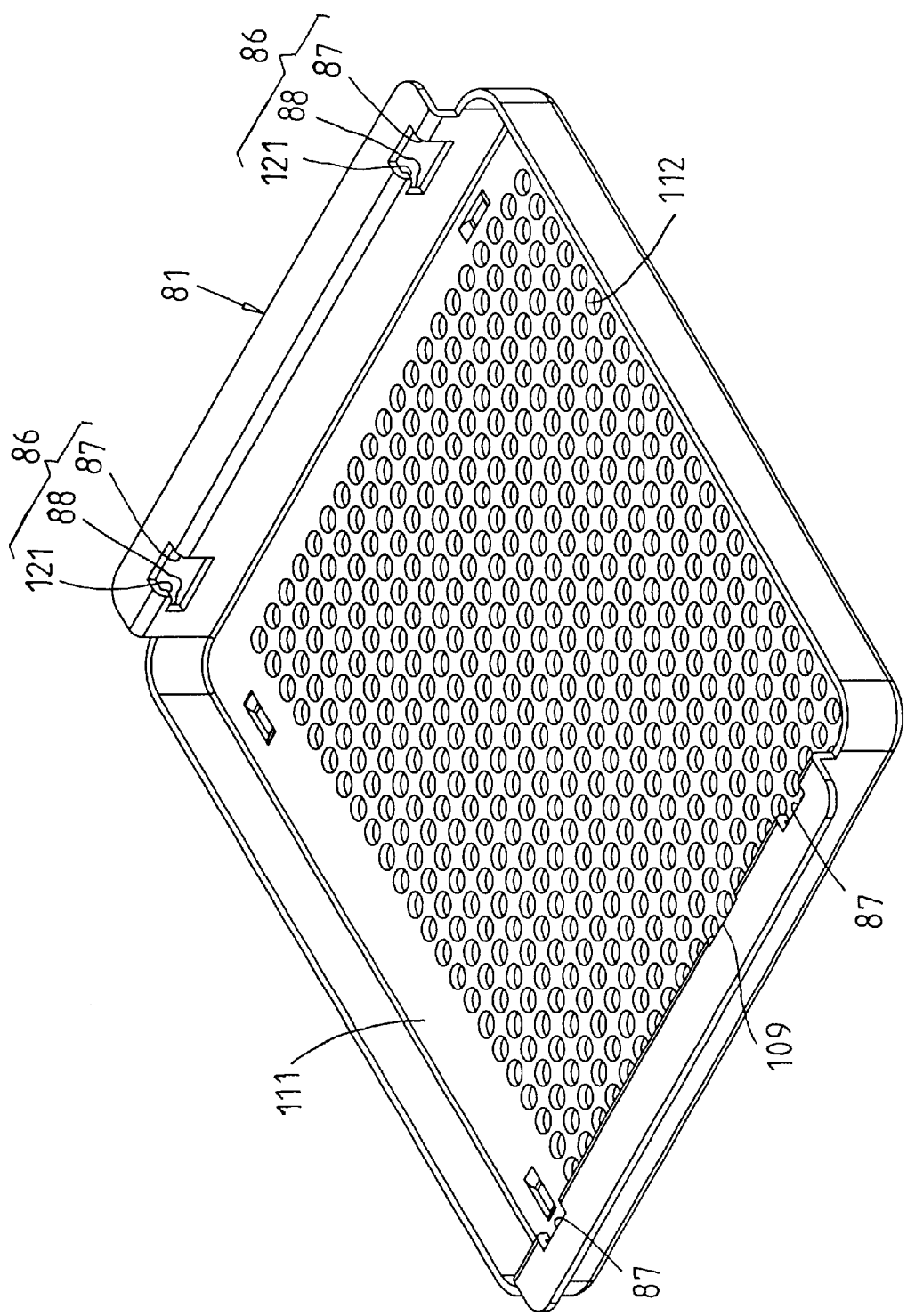
FIG. 13 is a perspective view of a first embodiment of the metal basin of the present invention.
Figure 42:
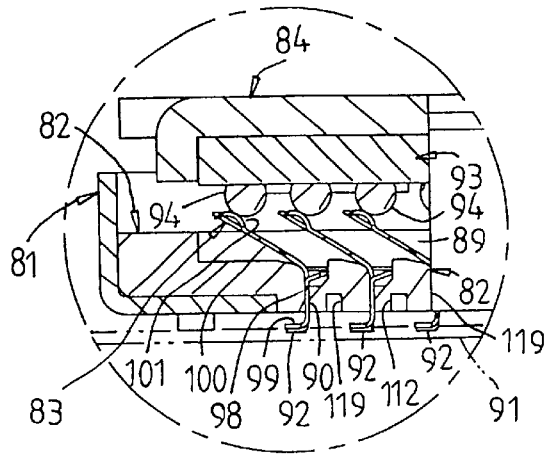
FIG. 42 is an enlarged view of the circled area 42 of FIG. 39.

Referring to FIGS. 1, 9 to 12 and 42, the insulating board 82 is snugly inlaid in the metal basin 81. The insulating board 82 has multiple receiving channels 89 and multiple insertion holes 90 disposed on the bottom of each receiving channel 89 and passing through the insulating board 82. Referring to FIGS. 11, 12 and 42, the bottom face of the insulating board 82 is formed with multiple domes 119 respectively corresponding to multiple insertion holes 90. Each insertion hole 90 passes through one dome 119. The domes 119 are respectively tenoned in the through holes 112 of the base board 111 of the metal basin 81 to prevent the conductive members 83 from contacting with the base board 111 of the metal basin 81 to lead to short circuit. The insulating board 82 can be also a plane panel without receiving channel 89.

Referring to FIGS. 1, 19 to 22, 31 to 34, 37, 42, 47, 52 and 57, the multiple conductive members 83 are one by one inlaid in the insertion holes 90 of the insulating board 82 and passed through the metal basin 81 to contact with the corresponding L.G.A. conductive contacts 92 of the circuit board 91 and also contact with the B.G.A. or L.G.A. terminals 94, 94' of the integrated circuit 93, 93'. Accordingly, the conductive contacts 92 of the circuit board 91 can be electrically connected with the terminals 94,94' of the integrated circuit 93, 93'.

Referring to FIGS. 1 to 8, 28 to 30 and 35, the upper cover 84 has a first side 84a, a second side 84b opposite to the first side, a third side 84c connected with one end of the first side 84a and second side 84b and a fourth side 84d connected with the other end of the first side 84a and second side 84b. The upper cover 84 further includes multiple latch tenons 95 disposed on the first and second sides 84a, 84b. Each latch tenon 95 has a guide angle 122 and can be correspondingly placed into the opening section 87 of the latch perforation 86 of the metal basin 81. Via the guide angle 122, the latch tenon 95 is guided by the guide slope 121 to smoothly slide into the latch section 88 of the latch perforation and latched therein, whereby the upper cover 84 can be latched with the metal basin 81 to cover upper side thereof.

Referring to FIGS. 1 to 8, 28 to 30 and 35, the upper cover 84 is made of metal material and has a receiving section 96 for accommodating the integrated circuit 93 therein. The receiving section 96 includes: a first locating section 97a disposed on the first side 84a, the first locating section 97a being integrally downward bent from the upper cover 84 and protruding from the bottom face of the upper cover 84, when the integrated circuit 93 is attached to the bottom face of the upper cover 84, the first locating section 97a being adjacent to a first edge 93a of the integrated circuit 93; a second locating section 97b disposed on the second side 84b, the second locating section 97b being integrally downward bent from the upper cover 84 and protruding from the bottom face of the upper cover 84, the second locating section 97b being adjacent to a second edge 93b of the integrated circuit 93; a third locating section 97c disposed on the third side 84c, the third locating section 97c being integrally downward bent from the upper cover 84 and protruding from the bottom face of the upper cover 84, when the integrated circuit 93 is attached to the bottom face of the upper cover 84, the third locating section 97c being adjacent to a third edge of the integrated circuit 93; and a fourth locating section 97d disposed on the fourth side 84d, the fourth locating section 97d being integrally downward bent from the upper cover 84 and protruding from the bottom face of the upper cover 84, when the integrated circuit 93 is attached to the bottom face of the upper cover 84, the fourth locating section 97d being adjacent to a fourth edge of the integrated circuit 93.

Figure 7:
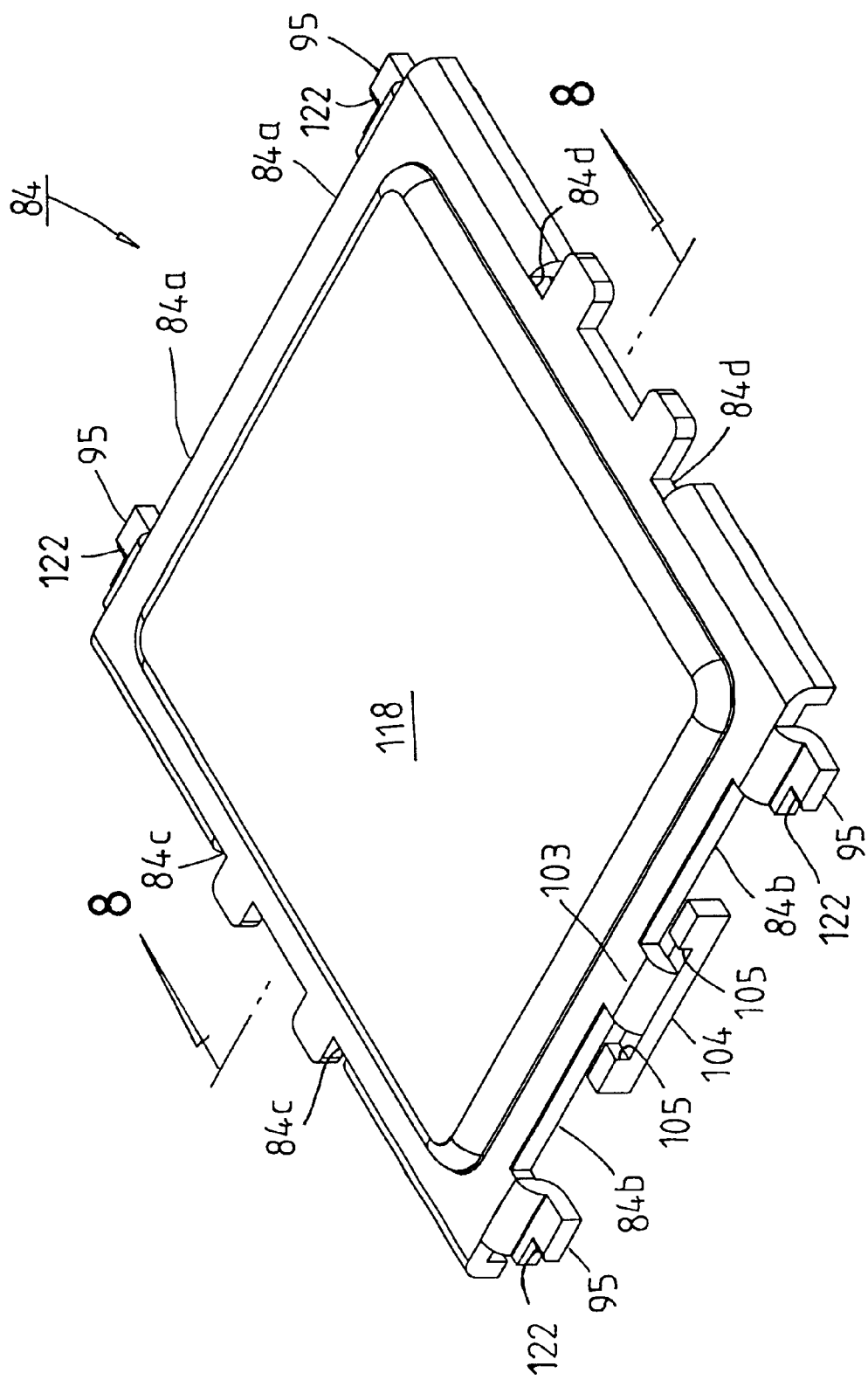
FIG. 7 is a top perspective view of a second embodiment of the upper cover of the present invention.
Figure 8:
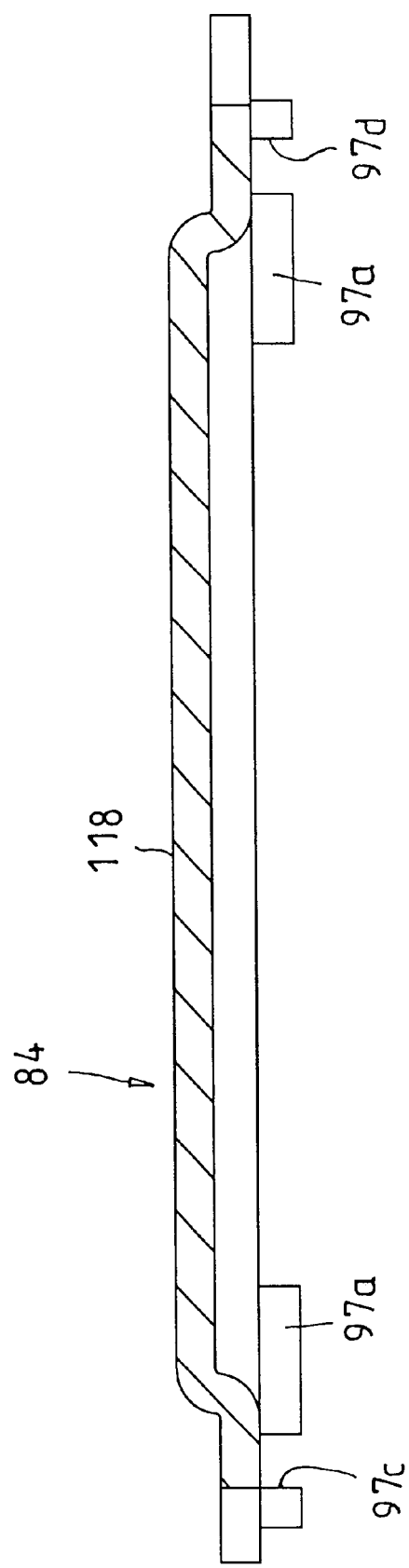
FIG. 8 is a sectional view taken along line 8—8 of FIG. 7.
Figure 9:
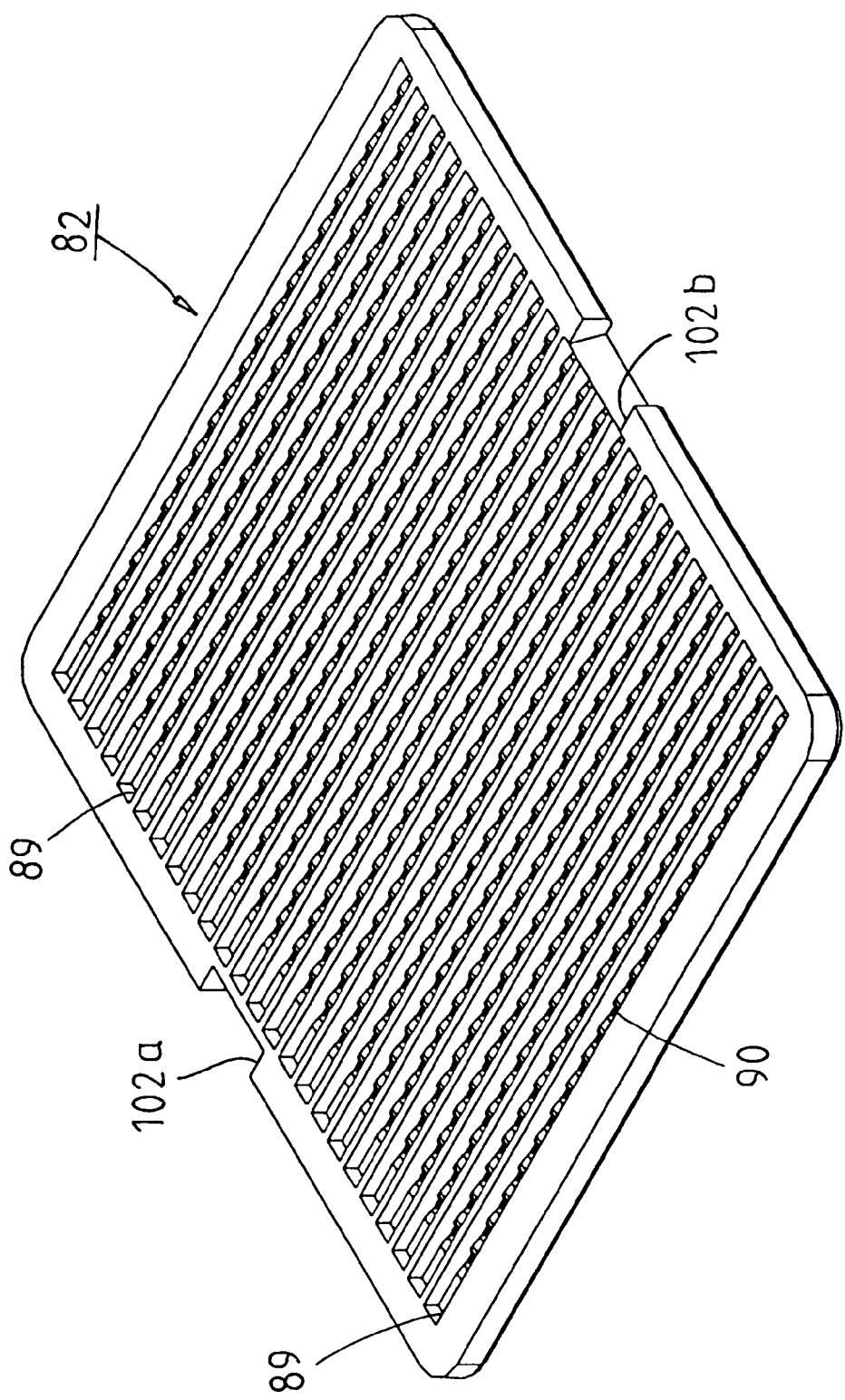
FIG. 9 is a perspective view of the insulating board of the present invention.
Figure 10:
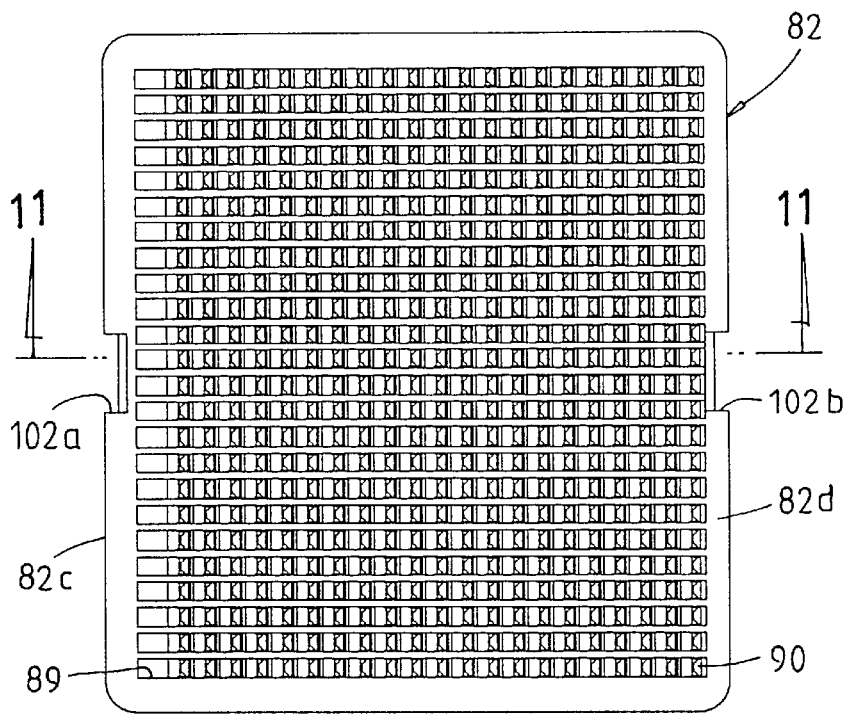
FIG. 10 is a top view of the insulating board of the present invention.

Referring to FIGS. 1, 2, 3 and 35, the center of the upper cover 84 is formed with a square hole 115. The chip main body 117 protruding from upper side of the chip carrier 116 of the integrated circuit 93 is passed through the square hole 115 of the upper cover 84. A radiator can be directly mounted on upper side of the upper cover 84 and tightly attached to upper face of the chip main body 117 to achieve good heat-radiating effect. The radiator is directly mounted on upper side of the square hole 115 of the upper cover 84 to totally shield the square hole 115. Therefore, the radiator can also achieve a good shielding effect to avoid leakage of electromagnetic wave generated by the integrated circuit and meet the standard of shielding of electromagnetic interference (EMI). Alternatively, as shown in FIGS. 7 and 8, the square hole 115 can be covered to make the upper cover 84 have a complete top face. The outer face is formed with a protruding section 118, while the inner face is formed with an upward recess 120 in which the chip main body 117 of the integrated circuit 93 is plugged. A heat-radiating paste is painted between the chip main body 117 and the recess 120 for conducting the heat generated by the chip main body 117 to the protruding section 118. A radiator (not shown) having radiating fins is tightly attached to upper side of the protruding section 118 and a radiating fan is mounted above the radiator to blow away the heat.

Accordingly, the upper cover 84 has heat conduction effect. In addition, the upper cover 84 with the protruding section 118 makes the land grid array (L.G.A.) or ball grid array (B.G.A.) type integrated circuit socket 80 of the present invention have better electromagnetic wave shielding effect.

Referring to FIGS. 1, 23 to 30 and 35, the clamping leaf springs 85 are mounted on the two latch sections 105 of the second side 84b of the upper cover 84 for resiliently pressing the second side 93b of the integrated circuit 93. By means of the first locating section 97a of the first side 84a of the upper cover 84 and the clamping leaf springs 85 disposed on the upper cover 84, the opposite first and second sides 93a, 93b of the integrated circuit 93, 93' are clamped to hold the integrated circuit 93, 93' under the bottom face of the upper cover 84.

Referring to FIGS. 1, 19 to 22, 31 to 34, 37, 42, 47, 52 and 57, each conductive member 83 has an inlay section 98, a first contact section 99, a second contact section 101 and a resilient section 100. The inlay section 98 is inlaid in the insertion hole 90 of the insulating board 82. The first contact section 99 integrally downward extends from the inlay section 98 and is bent to electrically contact with the L.G.A. conductive contacts 92 of the circuit board 91. The resilient section integrally obliquely or windingly transversely extends from the inlay section 98. When the conductive member 83 is compressed by the integrated circuit 93 into a final contact position, the projection length of the resilient section 100 on the face of the insulating board 82 is larger than the pitch between any two adjacent terminals 94 of the integrated circuit 93. Therefore, the resilient section 100 of the conductive member 83 is not limited by the extremely small pitch such as 1.27 mm pitch and can be designed with longer length, while having not high height. Therefore, the resilience of the resilient section 100 becomes very great to better contact with the terminal 94 of the integrated circuit. The conductive member 83 has the above special structure so that the manufacturing tolerance of the terminals of the integrated circuit 93, 93' and the tolerance resulting from the bending and deformation of the integrated circuit when pressed into the socket can be absorbed. The second contact section 101 is integrally formed at free end of the resilient section 100 for electrically contacting with the terminals 94, 94' of the integrated circuit 93, 93'. When the upper cover 84 and the integrated circuit 93, 93' are slided to the latch position and pressed toward the insulating board 82, the resilient section 100 and the second contact section 101 contact with the terminals 94, 94' of the integrated circuit 93, 93' and are pressed by the terminals 94, 94' into the receiving channels 89 of the insulating board 82. The insulating board 82 can be alternatively a plane board without receiving channel 89.

Referring to FIGS. 1, 9 to 12, 38, 39, 41, 43, 44, 46, 48, 49, 51, 53, 54 and 56, the third side 82c of the insulating board 82 is formed with a notch 102a and the fourth side 82d is formed with a notch 102b. A tool such as a screwdriver 114 can be extended into one of the notches to abut against the metal basin 81. By means of the screwdriver 114, the upper cover 84 can be pried and moved toward the latched position to make the latch tenons 95 of the upper cover 84 slide from the opening section 87 to the latch section 88 so as to latch the upper cover 84 and the integrated circuit 93, 93' in the metal basin 81. Reversely, a tool such as a screwdriver 114 can be inserted into the other notch to abut against the metal basin 81. By means of the screwdriver 114, the upper cover 84 can be pried and moved toward the unlatched position to make the latch tenons 95 of the upper cover 84 slide from the latch section 88 to the opening section 87 so as to take the upper cover 84 and the integrated circuit 93, 93' out from the metal basin 81.

Referring to FIGS. 1 to 8, 23 to 30, 35 and 36, the second locating section 97b of the upper cover 84 further includes a neck section 103, a latch beam 104 and two latch sections 105. The neck section 103 outward extends from the second side 84b of the upper cover 84 and is downward bent. The latch beam 104 extends from the neck section 103 in parallel to or substantially in parallel to the second side 84b of the upper cover 84, The two latch sections 105 are respectively formed at two ends of the latch beam 104. The clamping leaf spring 85 has a base section 106, latch clips 107 and leaf spring sections 108. The latch clips 107 respectively windingly extend from upper sides of two ends of the base section 106 for clamping the latch sections 105 of the upper cover 84 to mount the clamping leaf spring 85 on the second locating section 97b of the upper cover 84. The leaf spring sections 108 respectively obliquely extend from the rear ends of the latch clips 107 to resiliently press the second side 93b of the integrated circuit 93 so as to clamp and locate the integrated circuit 93, 93' on the bottom face of the upper cover 84.

Referring to FIGS. 1, 13 to 15 and 35, the second side of the metal basin 81 further has a locking section 109. The clamping leaf spring 85 further has a latch plate 110 bent from one end of the base section 106 to a corresponding leaf spring section 108. After the upper cover 84 and the integrated circuit 93 slide to make the latch tenons 95 of the upper cover 84 latched with the latch sections 88, the clamping leaf spring 85 is latched on the locking section 109 of the metal basin 81, whereby the upper cover 84 and the integrated circuit 93 are locked in the metal basin 81.

Figure 17:
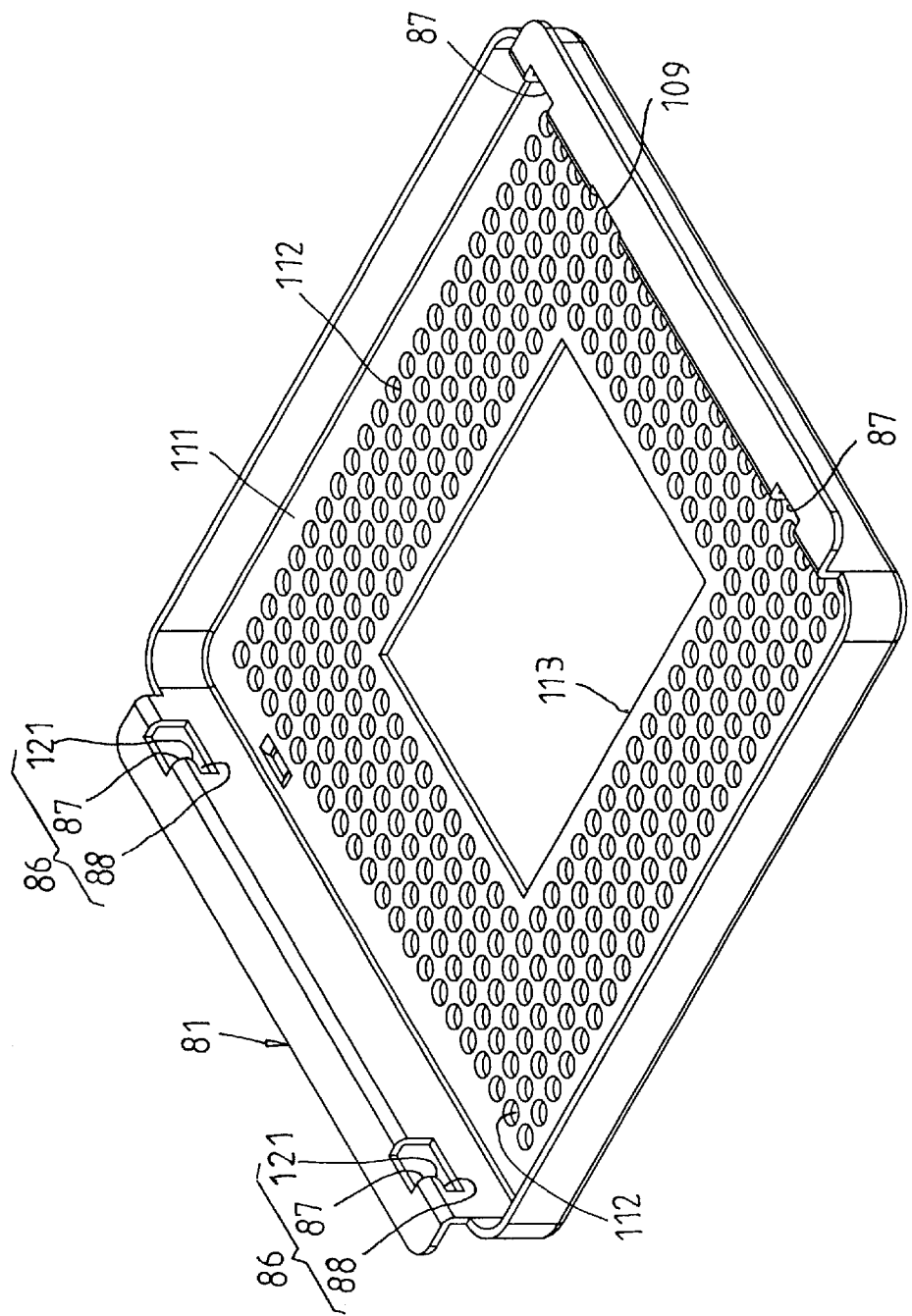
FIG. 17 is a perspective view of a second embodiment of the metal basin of the present invention.
Figure 18:
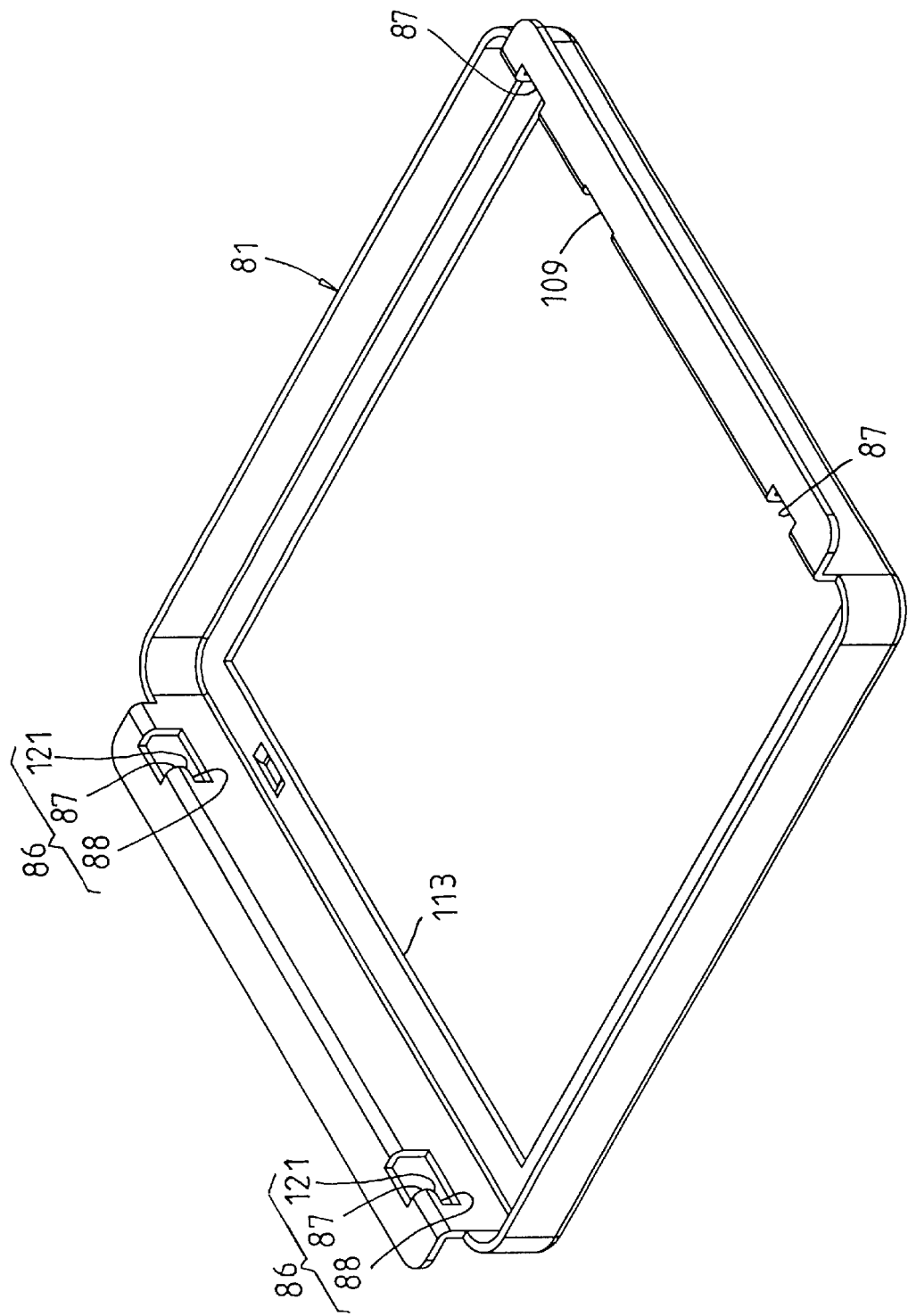
FIG. 18 is a perspective view of a third embodiment of the metal basin of the present invention.
Figure 20:
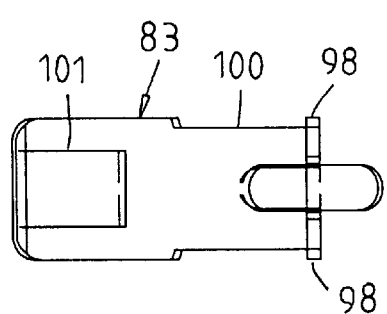
FIG. 20 is a top view of the conductive member of the present invention.

Referring to FIGS. 1 and 13 to 18, the bottom of the metal basin 81 has a base board 111 formed with multiple through holes 112 distributed over the base board 111 corresponding to the multiple conductive members 83. Alternatively, as shown in FIG. 17, the middle of the base board 111 is formed with a perforation 113. The through holes 112 around the perforation 113 correspond to the terminals 94 of the integrated circuit 93. Alternatively, as shown in FIG. 18, all the through holes 112 are omitted and the bas e board 111 is formed with a perforation 113 covering the area in winch all the conductive members 83 are inlaid.

Figure 19:
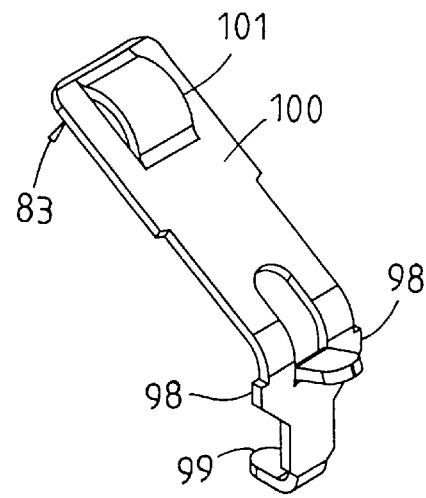
FIG. 19 is a perspective view of the conductive member of the present invention.
Figure 21:
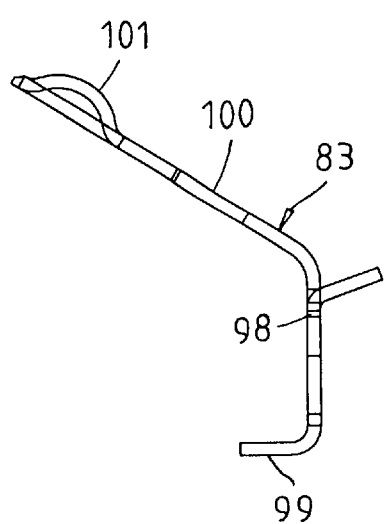
FIG. 21 is a left view of the conductive member of the present invention.
Figure 22:
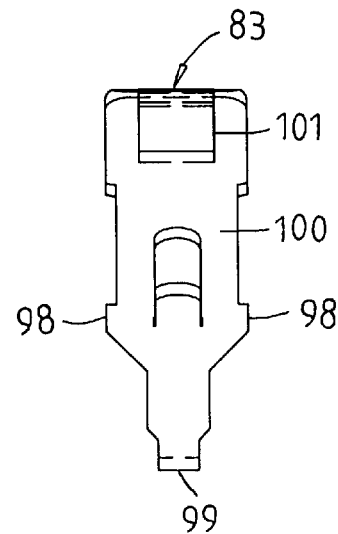
FIG. 22 is a front view of the conductive member of the present invention.
Figure 23:
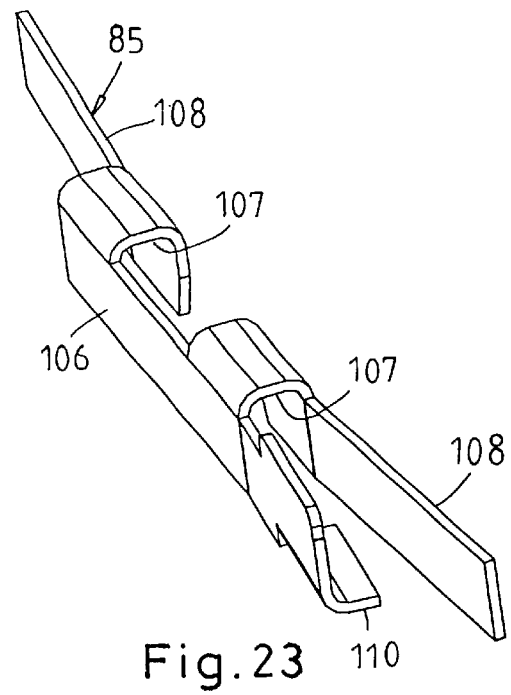
FIG. 23 is a perspective view of the clamping leaf spring of the present invention.
Figure 24:
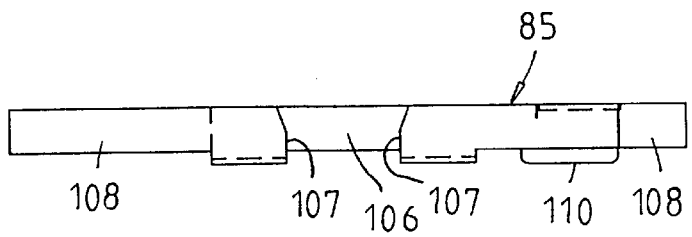
FIG. 24 is a back view of the clamping leaf spring of the present invention.
Figure 25:
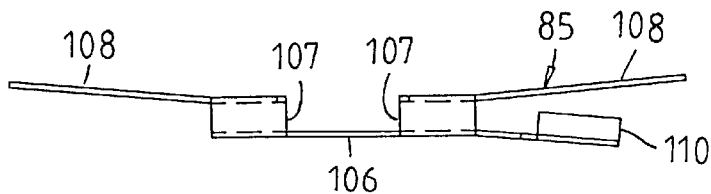
FIG. 25 is a top view of the clamping leaf spring of the present invention.
Figure 27:
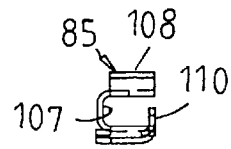
FIG. 27 is a right view of the clamping leaf spring of the present invention.
Figure 26:
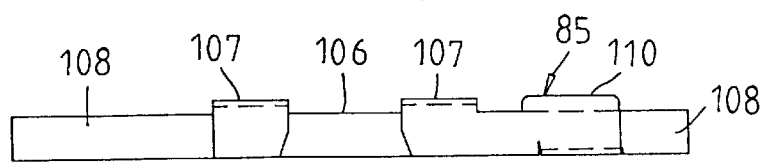
FIG. 26 is a front view of the clamping leaf spring of the present invention.
Figure 31:
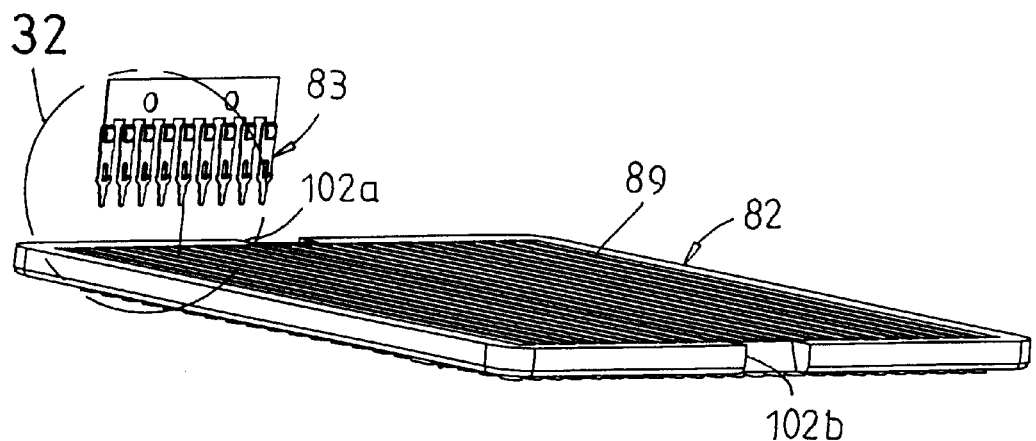
FIG. 31 is a perspective view showing that the conductive member of the present invention is to be mounted on the insulating board.
Figure 32:
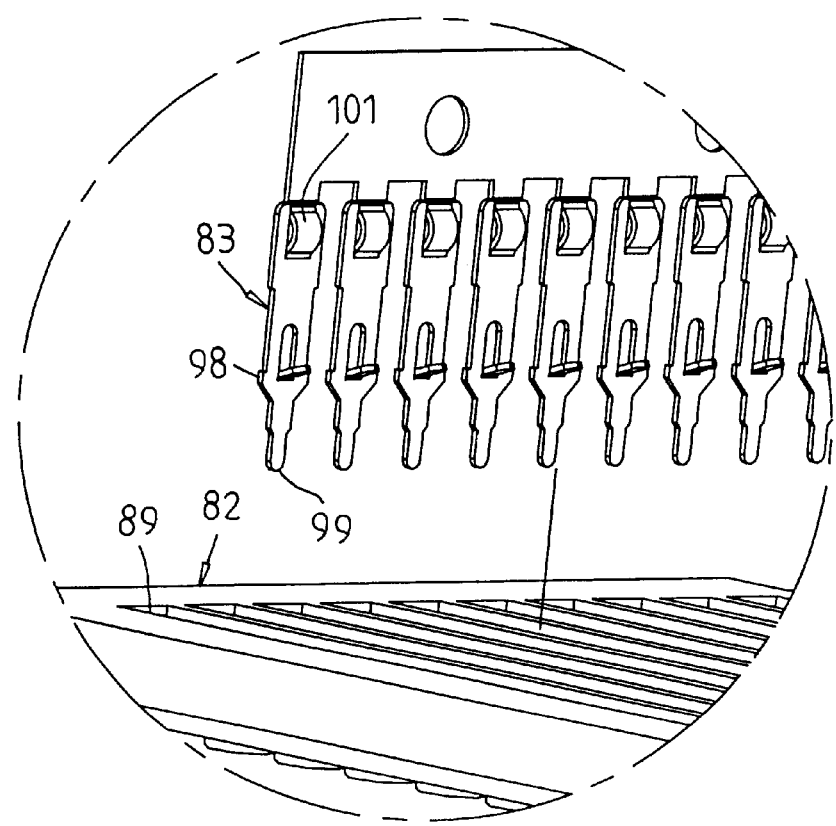
FIG. 32 is an enlarged view of the circled area 32 of FIG. 31.
Figure 33:
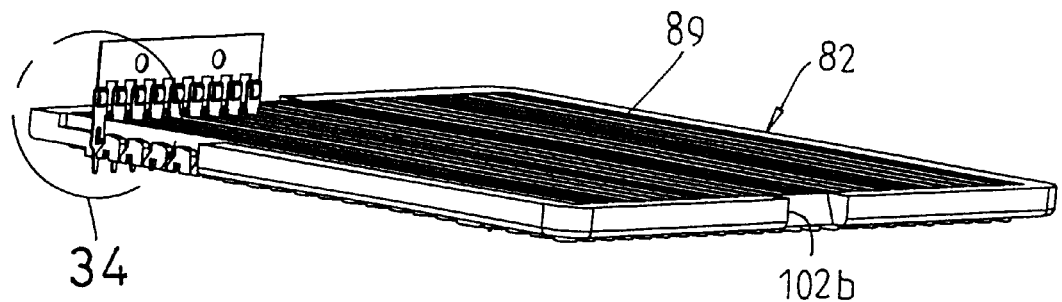
FIG. 33 is a perspective view showing that the conductive member of the present invention is mounted on the insulating board.
Figure 34:
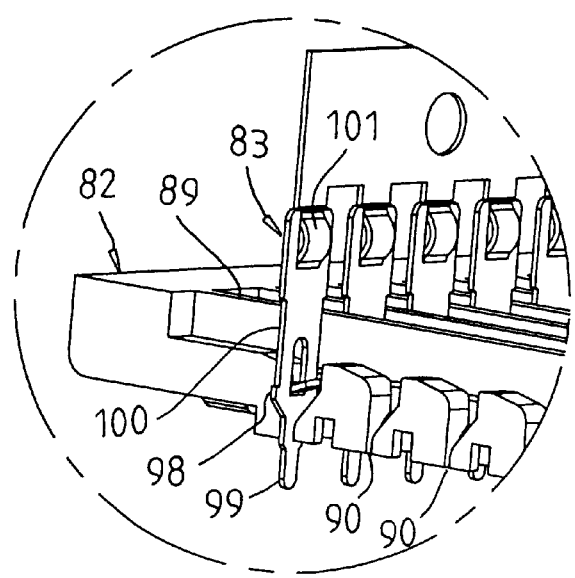
FIG. 34 is an enlarged view of the circled area 34 of FIG. 33.

When assembled, referring to FIGS. 31 to 34, the whole row of conductive members 83 are inserted into the insertion holes 90 of the insulating board 82 by an automatic assembling machine. Then the conductive members 83 are bent into the inclined state as shown in FIGS. 19,21 and 37. In addition, as shown in FIGS. 28 to 30 and 35,the two latch clips 107 of the clamping leaf spring 85 are respectively latched with the latch sections 105 of the upper cover 84 to locate the clamping leaf spring 85 on the second locating section 97b of the upper cover 84.

The leaf spring sections 108 respectively obliquely extend from the rear ends of the latch clips 107 to resiliently press the second side 93b of the integrated circuit 93,93' to clamp and locate the integrated circuit 93 on the bottom face of the upper cover 84 as shown in FIG. 35.

Referring to FIG. 35, the insulating board 82 is plugged into the metal basin 81. The upper cover 84 with the integrated circuit 93 covers the upper side of the metal basin 81 with the insulating board 82.

Figure 41:
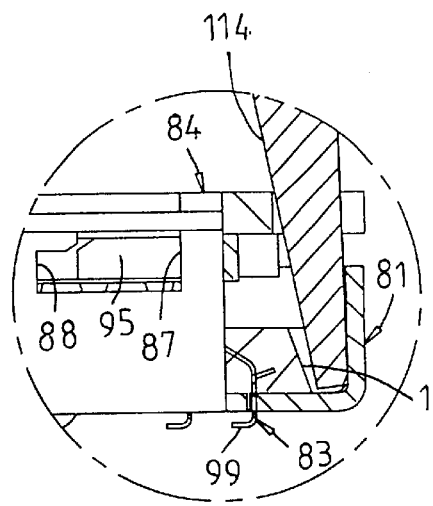
FIG. 41 is an enlarged view of the circled area 41 of FIG. 39.
Figure 40:
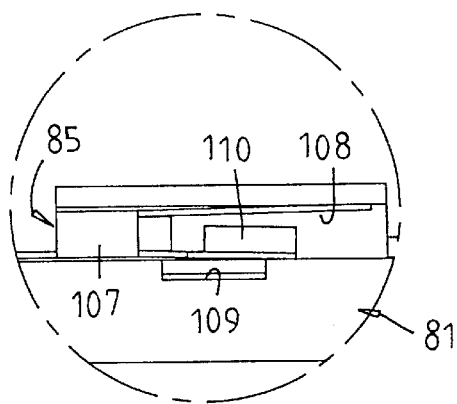
FIG. 40 is an enlarged view of the circled area 40 of FIG. 38.
Figure 38:
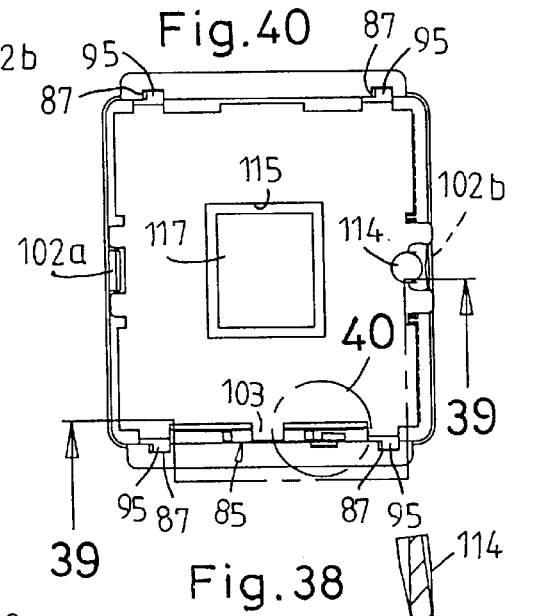
FIG. 38 is a top view showing that the ball grid array integrated circuit is mounted in the present invention, in which the upper cover has not yet latched in the latch section of the metal basin.
Figure 39:
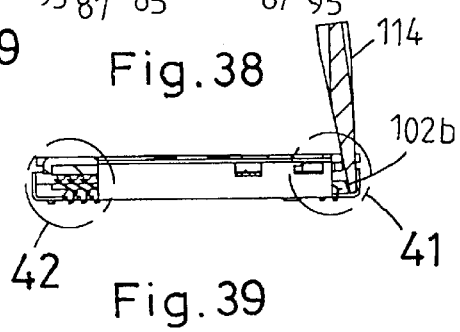
FIG. 39 is a sectional view taken along line 39—39 of FIG. 38.
Figure 46:
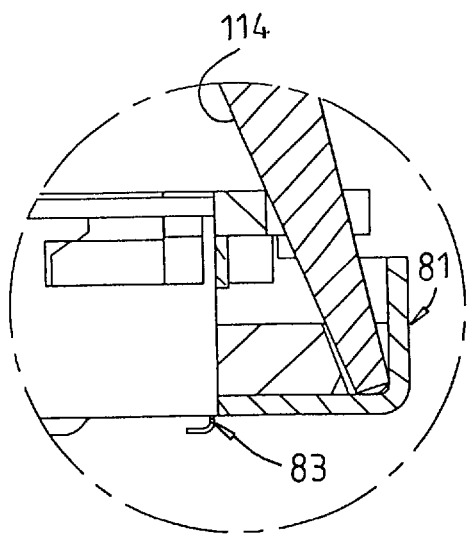
FIG. 46 is an enlarged view of the circled area 46 of FIG. 44.

Then, as shown in FIGS. 38, 39 and 41, the screwdriver 114 is inserted into the notch 102a of the insulating board 82 to the bottom of the metal basin 81. By means of the screwdriver 114, the upper cover 84 is pried and moved toward the latched position to make the latch tenons 95 of the upper cover 84 slide from the opening section 87 to the latch section 88 so as to latch the upper cover 84 and the integrated circuit 93 in the metal basin 81. Also, the latch plates 110 of the clamping leaf spring 85 are latched with the locking sections 109 of the metal basin 81 to lock the upper cover 84 and the integrated circuit 93 in the metal basin 81.

Figure 45:
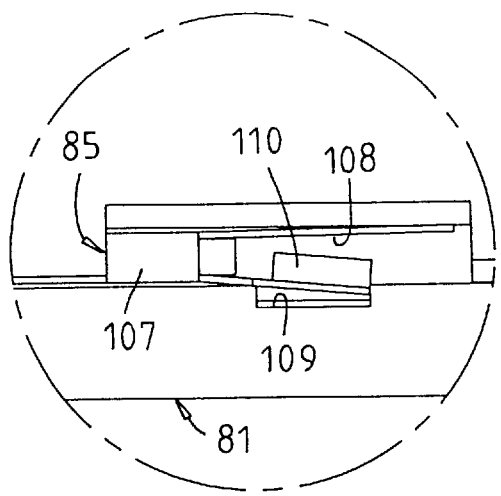
FIG. 45 is an enlarged view of the circled area 45 of FIG. 43.
Figure 47:
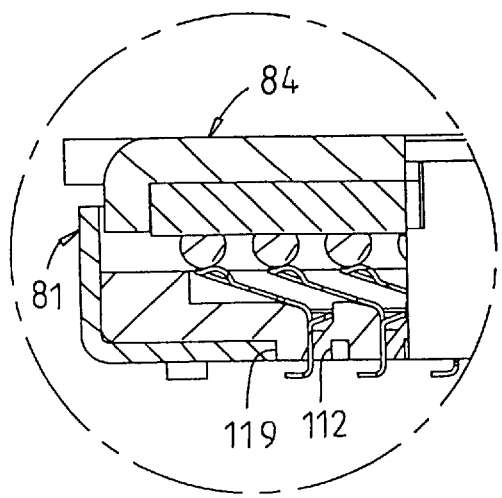
FIG. 47 is an enlarged view of the circled area 47 of FIG. 44.
Figure 43:
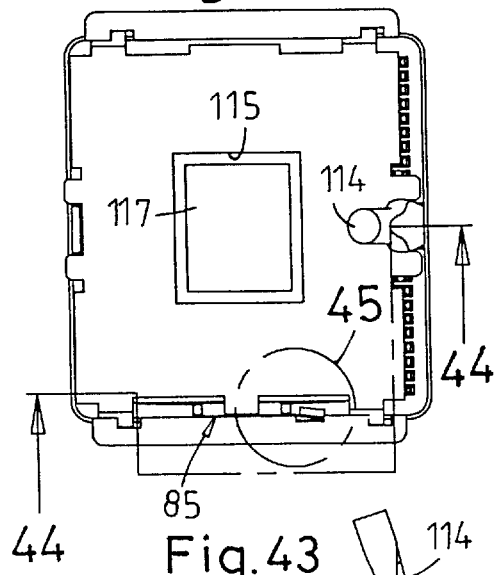
FIG. 43 is a top view showing that the ball grid array integrated circuit is mounted in the present invention, in which the upper cover is latched in the latch section of the metal basin.
Figure 44:
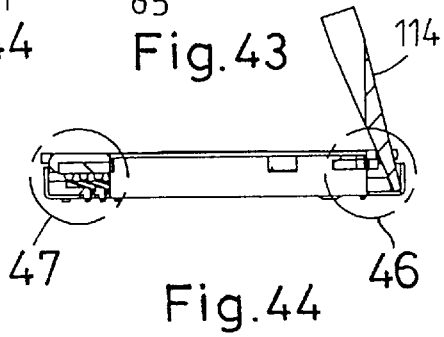
FIG. 44 is a sectional view taken along line 44—44 of FIG. 43.
Figure 51:
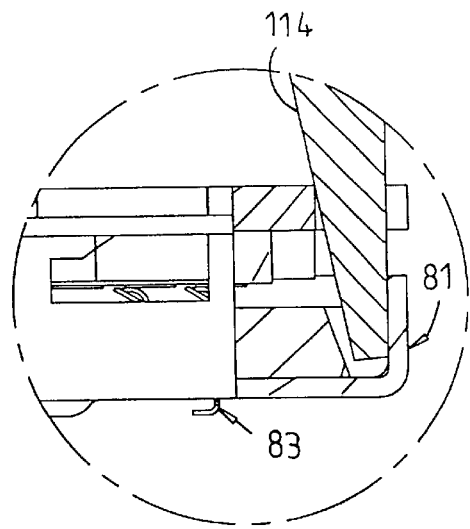
FIG. 51 is an enlarged view of the circled area 51 of FIG. 49.
Figure 50:
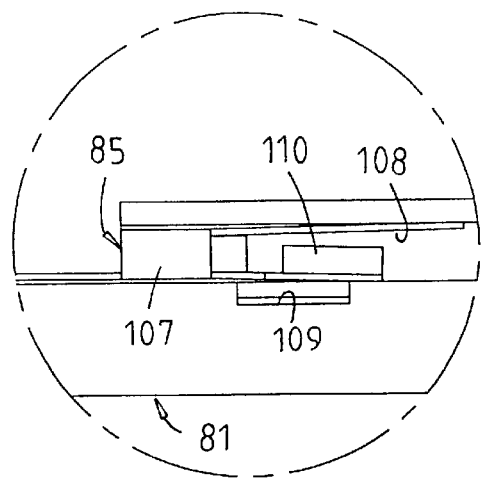
FIG. 50 is an enlarged view of the circled area 50 of FIG. 48.
Figure 52:
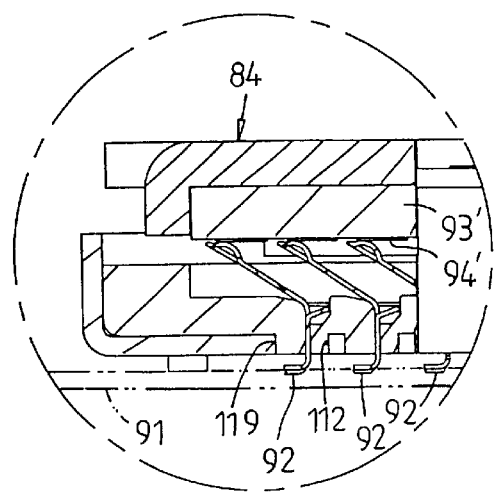
FIG. 52 is an enlarged view of the circled area 52 of FIG. 49.
Figure 48:
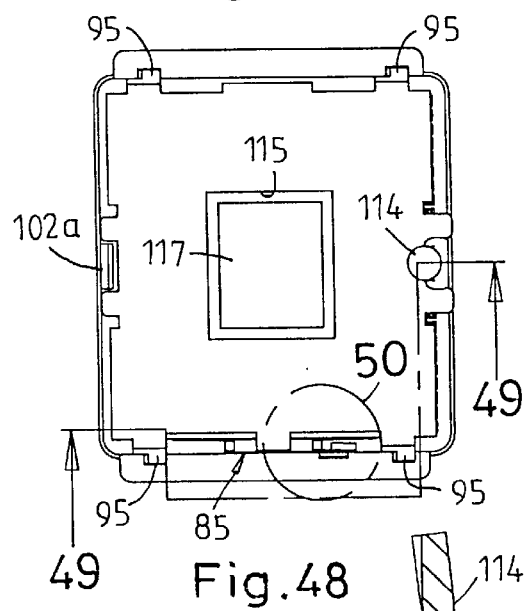
FIG. 48 is a top view showing that the land grid array integrated circuit is mounted in the present invention, in which the upper cover has not yet latched in the latch section of the metal basin.
Figure 49:
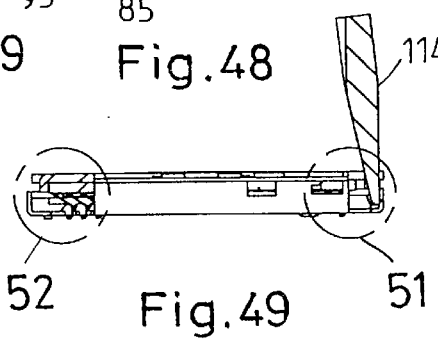
FIG. 49 is a sectional view taken along line 49—49 of FIG. 48.
Figure 56:
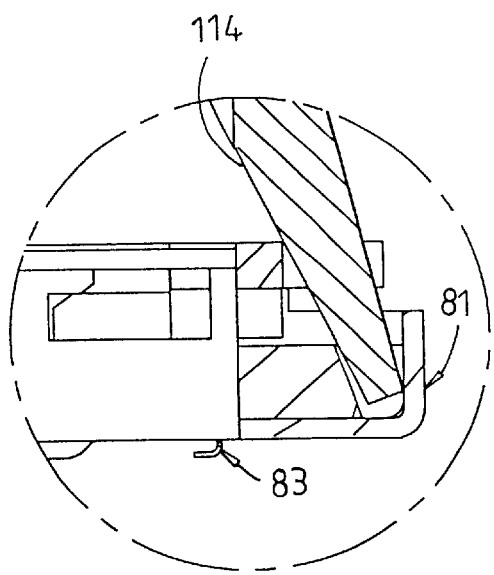
FIG. 56 is an enlarged view of the circled area 56 of FIG. 54.
Figure 55:
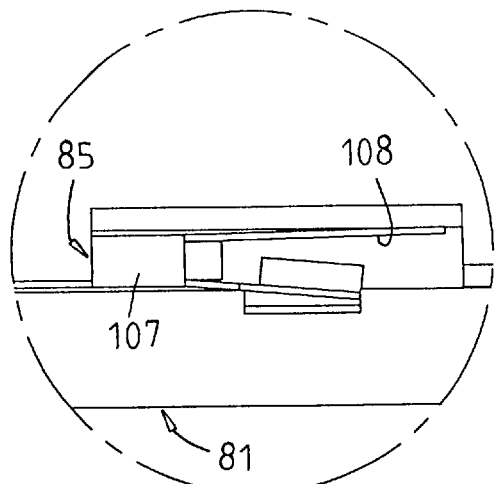
FIG. 55 is an enlarged view of the circled area 55 of FIG. 53.
Figure 57:
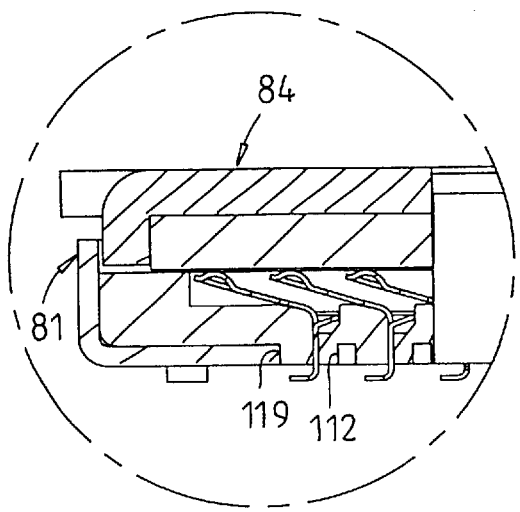
FIG. 57 is an enlarged view of the circled area 57 of FIG. 54.
Figure 53:
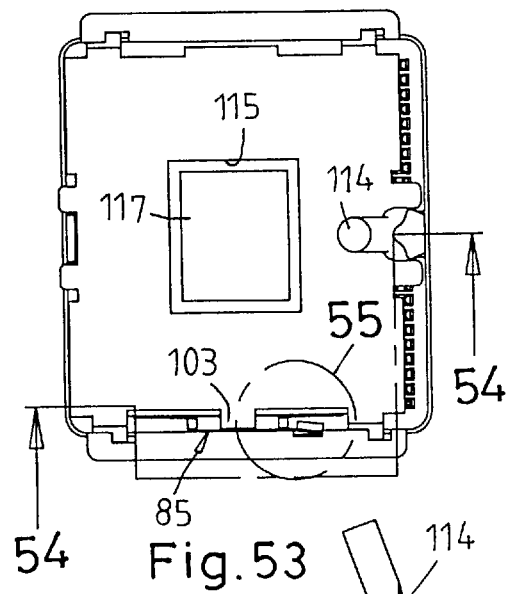
FIG. 53 is a top view showing that the land grid array integrated circuit is mounted in the present invention, in which the upper cover is latched in the latch section of the metal basin.
Figure 54:
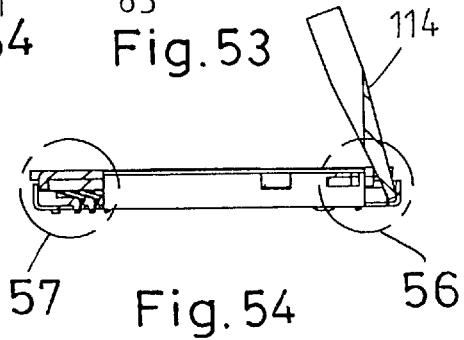
FIG. 54 is a sectional view taken along line 54—54 of FIG. 53.

When the upper cover 84 is moved toward the latched position to make the latch tenons 95 of the upper cover 84 slide from the opening section 87 to the latch section 88 so as to latch the upper cover 84 and the integrated circuit 93 in the metal basin 81, as shown in FIG. 45, the terminals 94 of the integrated circuit 93 are slided leftward and pressed and sunk, whereby the second contact sections 101 of the conductive members 83 electrically contact with the terminals 94 of the integrated circuit 93. In addition, when the second contact sections 101 of the conductive members 83 press and contact with the terminals 94 of the integrated circuit 93, the second contact sections 101 are pressed by the terminals 94 into the receiving channels 89 of the insulating board 82.

The resilient section 100 of the conductive member 83 integrally obliquely transversely extends from the inlay section 98 over the adjacent conductive member 83. Therefore, the resilient section 100 is not limited by the extremely small pitch such as 1.27 mm pitch and can be designed with longer length, while having not high height. Therefore, the resilience of the resilient section 100 becomes great to better and more truly contact with the terminal 94 of integrated circuit 93, 93'.

The resilient section 100 of the conductive member 83 has the above special structure so that the manufacturing tolerance of the terminals 94 of the integrated circuit 93, 93' and the tolerance resulting from the bending and deformation of the integrated circuit 93, 93' when pressed into the socket can be absorbed. Therefore, the contact ends of every conductive members 100 can filly and reliably contact with every terminals 94 of the integrated circuit 93, 93'. According to the above arrangement, the land grid array (L.G.A.) or ball grid array (B.G.A.) type integrated circuit socket of the present invention has the following advantages:

1. The resilient section of the conductive member integrally obliquely or windingly transversely extends from the inlay section. When the conductive member is compressed by the integrated circuit into a final contact position, the projection length of the resilient section on the face of the insulating board is larger than the pitch between any two adjacent terminals of the integrated circuit. Therefore, the resilient section of the conductive member is not limited by the extremely small pitch such as 1.27 mm pitch. Therefore, the resilient section can have longer length and greater resilience, while having not high height. Therefore, the resilient section can better and more truly contact with the terminal of integrated circuit.

2. The resilient section of the conductive member has the above special structure so that the manufacturing tolerance of the terminals of the integrated circuit and the tolerance resulting from the bending and deformation of the integrated circuit when pressed into the socket can be absorbed. Therefore, the contact ends of every conductive members can fully and reliably contact with every terminals of the integrated circuit.

3. The resilient section of the conductive member has the above special structure so that the entire socket becomes thinner and has stronger structure and it is ensured that the insulating board of the socket be not deformed.

4. The land grid array (L.G.A.) or ball grid array (B.G.A.) type integrated circuit socket of the present invention also achieves a good shielding effect to avoid leakage of electromagnetic wave generated by the integrated circuit and meet the standard of shielding of electromagnetic interference (EMI).

The above embodiments are only used to illustrate the present invention, not intended to limit the scope thereof. Many modifications of the above embodiments can be made without departing from the spirit of the present invention.

What is claimed is:

1. A land grid array or ball grid array type integrated circuit socket comprising:

(a) a metal basin which is a box body having a bottom face and multiple side walls, two opposite side walls of the metal basin being respectively formed with latch perforations, each latch perforation having an opening section and a latch section communicating with the opening section;

(b) an insulating board snugly inlaid in the metal basin, the insulating board having multiple insertion holes passing through the insulating board;

(c) multiple conductive members which are one by one inlaid in the insertion holes of the insulating board and passed through the metal basin to contact with multiple corresponding land grid array conductive contacts of a circuit board and contact with multiple land grid array or ball grid array terminals of the integrated circuit, whereby the conductive contacts of the circuit board are electrically connected with the terminals of the integrated circuit;

(d) an upper cover having a first side, a second side opposite to the first side, a third side connected with one end of the first side and second side and a fourth side connected with the other end of the first side and second side, the upper cover further including multiple latch tenons which are disposed on the first and second sides and can be correspondingly placed into the opening section of the latch perforation of the metal basin and latched in the latch section, whereby the upper cover is latched on the metal basin to cover upper side thereof, the upper cover having a receiving section for accommodating the integrated circuit therein, the receiving section including: a first locating section disposed on the first side, the first locating section being integrally downward bent from the upper cover and protruding from the bottom face of the upper cover, whereby when the integrated circuit is attached to the bottom face of the upper cover, the first locating section is adjacent to a first edge of the integrated circuit; a second locating section disposed on the second side, the second locating section being integrally downward bent from the upper cover and protruding from the bottom face of the upper cover, the second locating section being adjacent to a second edge of the integrated circuit; a third locating section disposed on the third side, the third locating section being integrally downward bent from the upper cover and protruding from the bottom face of the upper cover, whereby when the integrated circuit is attached to the bottom face of the upper cover, the third locating section is adjacent to a third edge of the integrated circuit; and a fourth locating section disposed on the fourth side, the fourth locating section being integrally downward bent from the upper cover and protruding from the bottom face of the upper cover, whereby when the integrated circuit is attached to the bottom face of the upper cover, the fourth locating section is adjacent to a four edge of the integrated circuit; and (e) clamping leaf springs mounted on the second side of the upper cover for resiliently pressing the second edge of the integrated circuit, whereby by means of the first locating section of the first side of the upper cover and the clamping leaf springs disposed on the upper cover, the opposite first and second edges of the integrated circuit are clamped to hold the integrated circuit under the bottom face of the upper cover.

2. The land grid array or ball grid array type integrated circuit socket as claimed in claim 1, wherein each conductive member has an inlay section, a first contact section, a second contact section and a resilient section, the inlay section being inlaid in the insertion hole of the insulating board, the first contact section integrally downward extending from the inlay section and being further bent to electrically contact with the land grid array conductive contacts of the circuit board, the resilient section integrally obliquely or windingly transversely extending from the inlay section, whereby when the conductive member is compressed by the integrated circuit into a final contact position, a projection length of the resilient section on the face of the insulating board is larger than the pitch between any two adjacent terminals of the integrated circuit, the second contact section being integrally formed at free end of the resilient section to slidably press and electrically contact with the terminals of the integrated circuit, when the resilient section and the second contact section slidably press and contact with the terminals of the integrated circuit, the resilient section and the second contact section being pressed by the terminals into the receiving channels of the insulating board.

3. The land grid array or ball grid array type integrated circuit socket as claimed in claim 1, wherein the third side and fourth side of the insulating board are respectively formed with notches, whereby a tool such as a screwdriver can be extended into one of the notches to abut against the metal basin and by means of the screwdriver, the upper cover can be pried and moved toward a latched position to make the latch tenons of the upper cover slide from the opening section to the latch section so as to latch the upper cover and the integrated circuit in the metal basin and reversely, a tool such as a screwdriver can be inserted into the other notch to abut against the metal basin and by means of the screwdriver, the upper cover can be pried and moved toward an unlatched position to make the latch tenons of the upper cover slide from the latch section to the opening section so as to take the upper cover and the integrated circuit out from the metal basin.

4. The land grid array or ball grid array type integrated circuit socket as claimed in claim 1, wherein the second locating section of the upper cover further includes a neck section, a latch beam and two latch sections, the neck section outward extending from the second side of the upper cover and being downward bent, the latch beam extending from the neck section in parallel to or substantially in parallel to the second side of the upper-cover, the two latch sections being respectively formed at two ends of the latch beam, the clamping leaf spring having a base section, latch clips and leaf spring sections, the latch clips respectively windingly extending from upper sides of two ends of the base section for clamping the latch sections of the upper cover to mount the clamping leaf spring on the second locating section of the upper cover, the leaf spring sections respectively obliquely extending from the rear ends of the latch clips to resiliently press the second edge of the integrated circuit so as to clamp and locate the integrated circuit on the bottom face of the upper cover.

5. The land grid array or ball grid array type integrated circuit socket as claimed in claim 4, wherein the second side of the metal basin further has a locking section, the clamping leaf spring farther having a latch plate bent from one end of the base section to a corresponding leaf spring section, whereby after the upper cover and the integrated circuit slide to make the latch tenons of the upper cover latched with the latch sections, the clamping leaf spring is latched on the locking section the metal basin to make the upper cover and the integrated circuit locked in the metal basin.

6. The land grid array or ball grid array type integrated circuit socket as claimed in claim 1, wherein the bottom of the metal basin has a base board formed with multiple through holes corresponding to the multiple conductive members.

7. The land grid array or ball grid array type integrated circuit socket as claimed in claim 1, wherein the bottom of the metal basin has a base board, a center of the base board being formed with a perforation, the base board being formed with multiple through holes corresponding to the multiple conductive members.

8. The land grid array or ball grid array type integrated circuit socket as claimed in claim 1, wherein the bottom of the metal basin has a base board, the base board being formed with a perforation covering an area in which all the conductive members are inlaid.

9. The land grid array or ball grid array type integrated circuit socket as claimed in claim 1, wherein a guide slope is formed on an adjoining section adjoining the opening section with the latch section of the latch perforation of the metal basin, whereby the latch tenon of the upper cover can be guided by the guide slope to smoothly slide into the latch section of the latch perforation and be fixed therein.

10. The land grid array or ball grid array type integrated circuit socket as claimed in claim 1, wherein the upper cover is further formed with a hole, the integrated circuit being passed through the hole of the upper cover to contact with heat-radiating fins mounted on upper side of the upper cover.

11. The land grid array or ball grid array type integrated circuit socket as claimed in claim 1, wherein the upper cover has a complete top face for totally shielding the integrated circuit and avoiding leakage of electromagnetic wave generated by the integrated circuit.

12. The land grid array or ball grid array type integrated circuit socket as claimed in any of claims 1 to 11, wherein the upper cover is made of metal board.

13. The land grid array or ball grid array type integrated circuit socket as claimed in any of claims 1 to 11, wherein the insulating board further has multiple receiving channels and the insertion holes are formed on the bottoms of the receiving channels.

* * * * *